（12）United States Patent
Liu et al.

(10) Patent No.: US 10,749,104 B2
(45) Date of Patent: Aug. 18, 2020

(54) COMBINATORIAL MAGNETO ELECTRIC SPIN ORBIT LOGIC

(71) Applicant: Intel Corporation, Santa Clara, CA (US)

(72) Inventors: Huichu Liu, Santa Clara, CA (US); Daniel Morris, Hillsboro, OR (US); Tanay Karnik, Portland, OR (US); Sasikanth Manipatruni, Hillsboro, OR (US); Kaushik Vaidyanathan, Santa Clara, CA (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 16/217,807

(22) Filed: Dec. 12, 2018

(65) Prior Publication Data

US 2020/0194663 A1  Jun. 18, 2020

(51) Int. Cl.
*H01L 43/02* (2006.01)
*H03K 19/18* (2006.01)
*H01L 27/22* (2006.01)
*H01L 43/10* (2006.01)

(52) U.S. Cl.
CPC .............. *H01L 43/02* (2013.01); *H01L 27/22* (2013.01); *H01L 43/10* (2013.01); *H03K 19/18* (2013.01)

(58) Field of Classification Search
CPC ......... H01L 43/02; H01L 43/10; H01L 27/22; H01L 27/222; H01L 27/228; H03K 19/18
See application file for complete search history.

(56) References Cited

U.S. PATENT DOCUMENTS

2020/0091407 A1* 3/2020 Liu .................. G11C 11/18
2020/0091414 A1* 3/2020 Liu .................. H01L 43/065

OTHER PUBLICATIONS

Liu, L, et al., "Spin torque switching with the giant spin Hall effect of tantalum", Science 336, (2012), 555-558.
Liu, Luqiao, et al., "Spin-Torque Ferromagnetic Resonance Induced by the Spin Hall Effect", Phys. Rev. Lett. 106, 036601, (2011), 1-4.
Liu, Ming, et al., "Voltage control of magnetism in multiferroic heterostructures", Phil. Trans. R. Soc. A, 372, 20120439, (2014), 15 pgs.
Manipatruni, S, et al., "Spin-Orbit Logic with Magnetoelectric Nodes: A Scalable Charge Mediated Nonvolatile Spintronic Logic", arXiv:1512.05428., (2015), 1-22.

(Continued)

*Primary Examiner* — Mark V Prenty
(74) *Attorney, Agent, or Firm* — Schwegman Lundberg & Woessner, P.A.

(57) ABSTRACT

Some embodiments include apparatuses having a first magnet, a first stack of layers coupled to a first portion of the first magnet, a first layer coupled to a second portion of the first magnet, a second magnet, a second stack of layers coupled to a first portion of the second magnet, a second layer coupled to a second portion of the second magnet, a conductor coupled to the first stack of layers and to the second layer, and a conductive path coupled to the first portion of the first magnet and to the first portion of the second magnet, each of the first and second layers including a magnetoelectric material, each of the first and second stacks of layers providing an inverse spin orbit coupling effect.

25 Claims, 17 Drawing Sheets

(56) References Cited

OTHER PUBLICATIONS

Pai, Chi-Feng, et al., "Spin transfer torque devices utilizing the giant spin Hall effect of tungsten", Applied Physics Letters, 101(12), (2012), 18 pgs.

Rojas Sanchez, J, et al., "Spin-to-charge conversion using Rashba coupling at the interface between non-magnetic materials", Nature Communications, 4:2944, (2013), 7 pgs.

\* cited by examiner

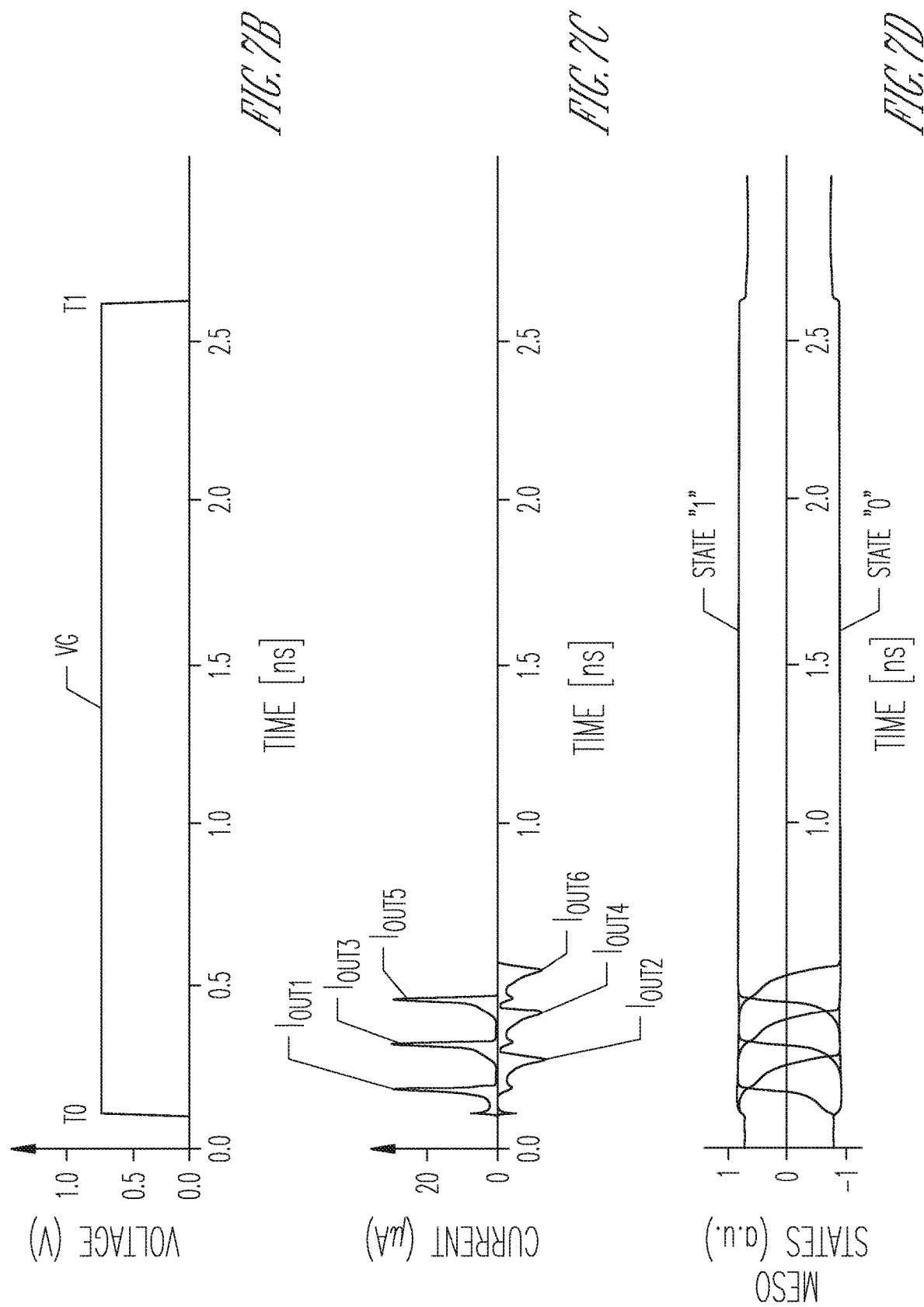

US 10,749,104 B2

COMBINATORIAL MAGNETO ELECTRIC SPIN ORBIT LOGIC

BACKGROUND

Spintronics is the study of the intrinsic spin of the electron and its associated magnetic moment in solid-state devices. Spintronic logic may be implemented in integrated circuit devices that use a physical variable of magnetization or spin as a computation variable. Such variables can be non-volatile (e.g., preserving a computation state when the power to an integrated circuit is turned off). Non-volatile logic can improve power and computational efficiency by allowing architects to put a processor into un-powered sleep states more often, thereby reducing energy consumption. Existing spintronic logic generally suffers from high energy consumption and relatively long switching times.

BRIEF DESCRIPTION OF THE DRAWINGS

FIG. 7B is a waveform diagram for a signal in the combinatorial MESO logic of FIG. 7A, according to some embodiments described herein.

FIG. 7C is a waveform diagram for currents in MESO devices of the combinatorial MESO logic of FIG. 7A, according to some embodiments described herein.

FIG. 7D is a waveform diagram showing switching of states in MESO devices of the combinatorial MESO logic of FIG. 7A, according to some embodiments described herein.

DETAILED DESCRIPTION

The magnetoelectric (ME) effect has the ability to manipulate the magnetization of (and the associated spin of electrons in) a material by an applied electric field. Since an estimated energy dissipation per unit area per magnet switching event through the ME effect is an order of magnitude smaller than it is with the spin-transfer torque (STT) effect, ME materials have the capability for next-generation memory and logic applications.

Magnetoelectric Spin Orbit (MESO) logic devices (e.g., gates), when cascaded with one another, may suffer from back propagation of signals that may switch magnets unintentionally. The techniques described herein include a MESO logic which is a combination of various physical phenomena for spin-to-charge and charge-to-spin conversion, where the MESO logic includes an input magnet and a stack of layers for spin-to-charge conversion. Spin-to-charge conversion is achieved via one or more layers with the inverse Rashba-Edelstein effect (or inverse spin Hall effect) wherein a spin current injected from the input magnet produces a charge current. The sign of the charge current is determined by the direction of the injected spin and thus of magnetization. In the described techniques, charge-to-spin conversion is achieved via the magnetoelectric effect in which the charge current produces a voltage on a capacitor, including a layer with magnetoelectric effect, leading to switching the magnetization of an output magnet. The magnetic response of a magnet is according to an applied exchange bias from the magnetoelectric effect.

The techniques described herein have many technical effects. For example, high speed operation of the logic (e.g., 100 picoseconds (ps)) can be achieved via the use of magnetoelectric switching operating on semi-insulating nanomagnets. In some examples, switching energy is reduced (e.g., to 1-10 attojoules (aJ)) because the current needs to be "on" for a shorter time (e.g., approximately 3 ps) in order to charge the capacitor. In some examples, in contrast to the spin current, charge current does not attenuate when it flows through an interconnect. Other technical effects will be evident from various examples and figures described below.

Some examples of the techniques described herein include coupling MESO devices to form combinatorial MESO logic. Some other examples of the described techniques include combining combinatorial MESO logic with sequential MESO logic to complete a logic function (e.g., logic circuit). The described MESO logic circuits consume relatively low power, allowing them to be used to construct a MESO logic family for ultra-low-energy MESO-based computing systems.

Figure 1:
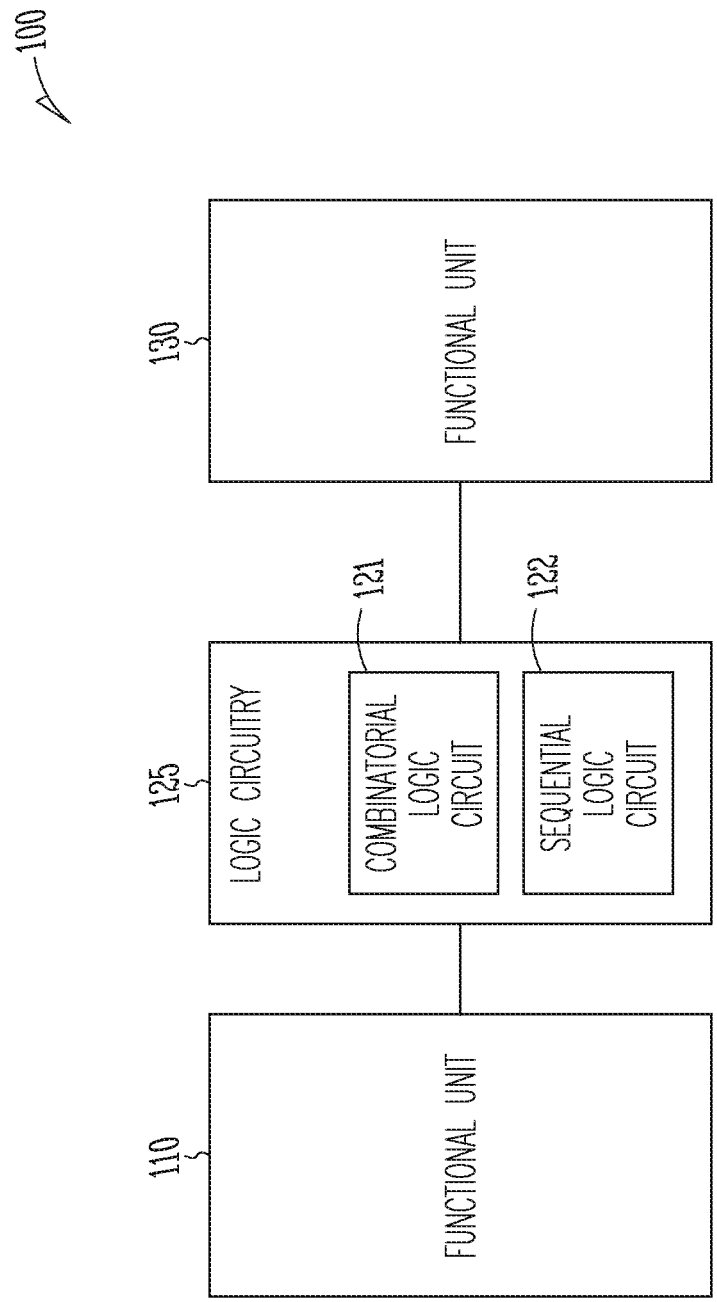
FIG. 1 shows an apparatus including logic circuitry according to some embodiments described herein.

FIG. 1 shows an apparatus 100 including logic circuitry 125 according to some embodiments described herein.

Apparatus 100 can include or be included in an electronic device or system. Examples of such devices or systems include computers (e.g., servers, desktops, laptops, and notebooks), tablets, cellular phones, wearable electronic things, Internet of Things (IoT) devices, integrated circuit chips (e.g., processors), and other electronic devices or systems.

As shown in FIG. 1, apparatus 100 can also include functional units 110 and 130. As an example, apparatus 100 can include an integrated circuit (IC) chip (e.g., a processor), where functional units 110 and 130 and logic circuitry 125 can be part of the IC chip. Each of functional units 110 and 130 can be designed to perform a specific function. Logic circuitry 125 can include a combinatorial logic circuit 121 and a sequential logic circuit 122 to perform one or more logic functions (e.g., logic operations). Each of combinatorial logic circuit 121 and sequential logic circuit 122 can include MESO logic and MESO devices described below with reference to FIG. 2A through FIG. 8E.

Figure 2A:
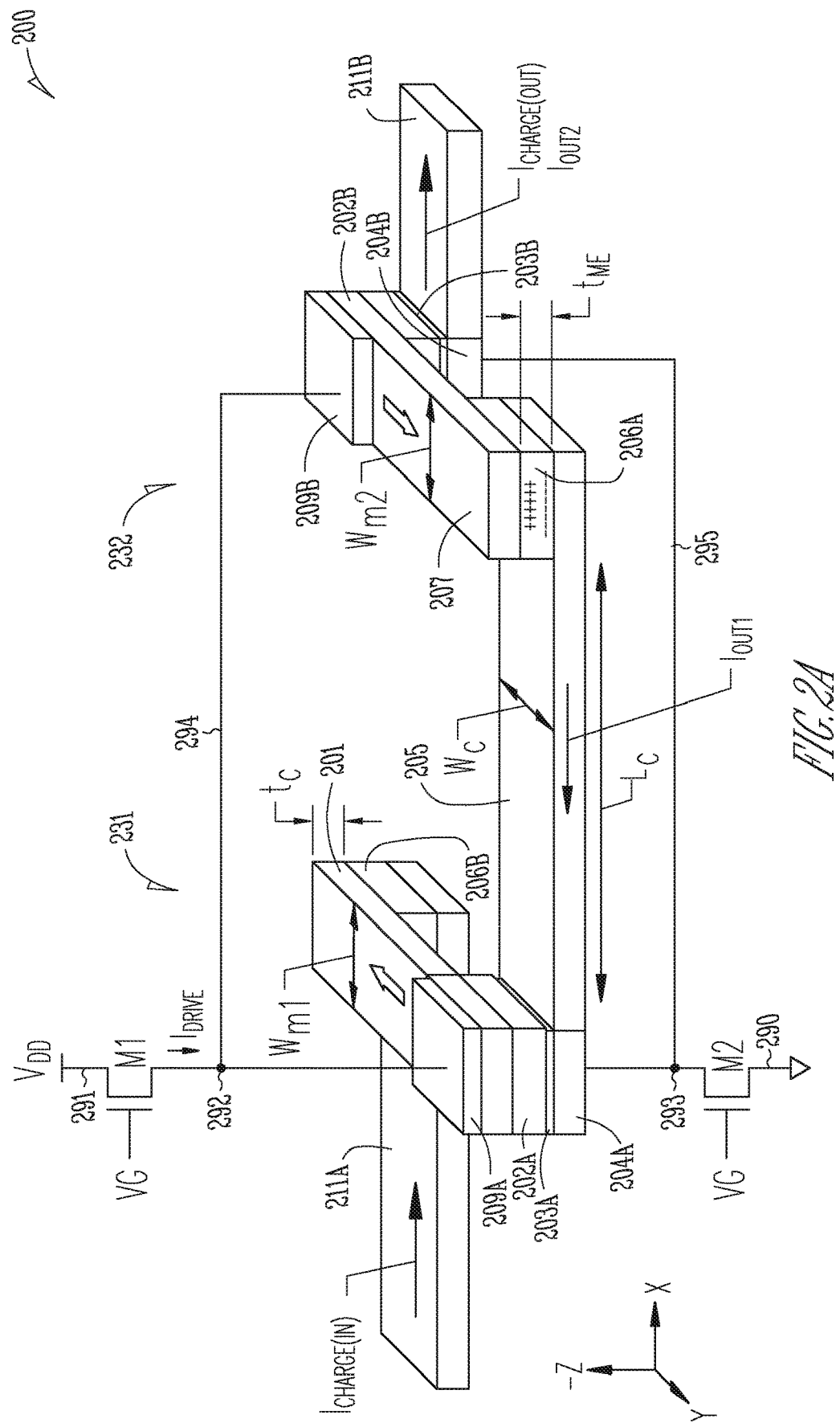
FIG. 2A shows a unidirectional magnetoelectric spin orbit (MESO) logic, according to some embodiments described herein.
Figure 2C:
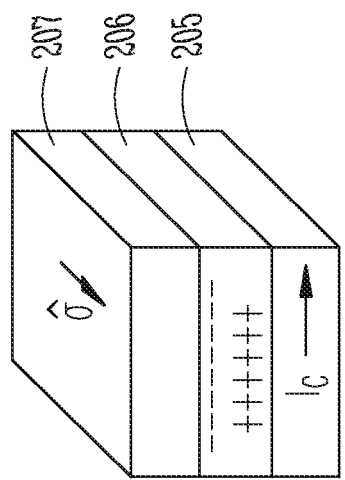
FIG. 2C shows a magnetoelectric material stack at the output of an interconnect, according to some embodiments described herein.
Figure 2B:
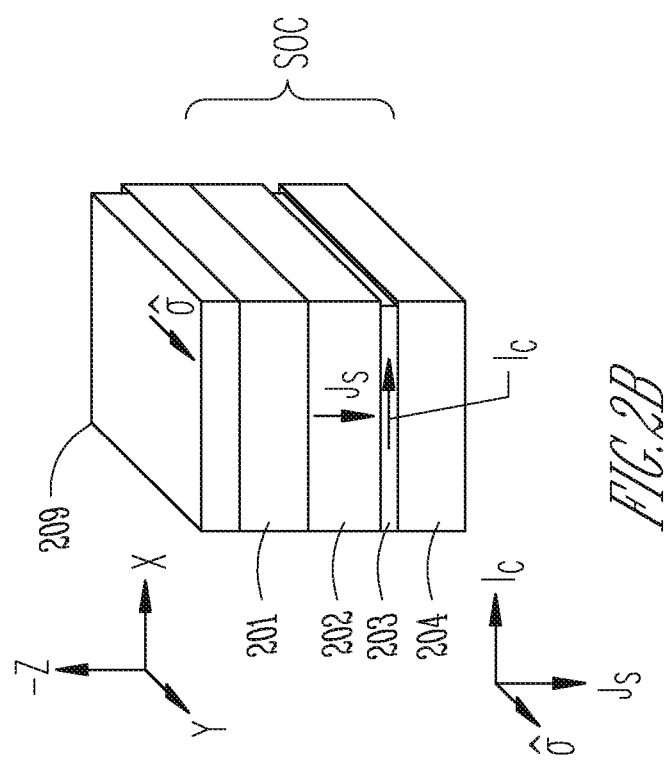
FIG. 2B shows a material stack at the input of an interconnect, according to some embodiments described herein.

FIG. 2A shows a unidirectional magnetoelectric spin orbit (MESO) logic 200, according to some embodiments described herein. FIG. 2B shows a material stack at the input of an interconnect, according to some embodiments described herein. FIG. 2C shows a magnetoelectric material stack at the output of an interconnect, according to some embodiments described herein. MESO logic 200 can be used in (e.g., used as part of) a combinatorial logic circuit (e.g., combinatorial logic circuit 121 of FIG. 1).

As shown in FIG. 2A, FIG. 2B, and FIG. 2C, MESO logic (e.g., MESO logic circuit) 200 can include a magnet 201, a stack of layers (e.g., layers 202, 203, and 204, which are also labeled 202A, 203A, and 204A, respectively, and 202B, 203B, and 204B, respectively), a conductor 205, a magnetoelectric (ME) layer 206 (also labeled 206A and 206B), a magnet 207 (which is different from magnet 201), a contact 209A, and a contact 209B. In FIG. 2B, contact 209 can represent contact 209A or 209B. Magnets 201 and 207 have in-plane magnetic anisotropy. MESO logic 200 can be coupled to a conductor 211A (e.g., input conductor or input interconnect) and a conductor 211B (e.g., output conductor or output interconnect). Each of conductors 205, 211A, and 211B can be a charge interconnect conductor, which can include a non-magnetic charge conductor.

As shown in FIG. 2A, conductor 205 can be coupled to at least a portion (e.g., a layer 204A) of a stack of layers 202A, 203A, and 204A, and to ME layer 206A. Conductor 205 can have a width Wc, and a length Lc from the interface of layer 204A to ME layer 206A. Each of conductors 205, 211A, and 211B can include a conductive material (e.g., metal (e.g., Cu, Ag, Al, and Au), an alloy, or other conductive materials). Conductors 205, 211A, and 211B can be formed from the same material (e.g., the same metal or the same alloy).

Magnet 201 can include a portion coupled to (e.g., contacting) the stack of layers 202A, 203A, and 204A, and another portion coupled to (e.g., contacting) ME layer 206B. Magnet 207 can include a portion coupled to (e.g., contacting) a stack of layers 202B, 203B, and 204B, and another portion coupled to (e.g., contacting) ME layer 206A.

Each of the stack of layers 202A, 203A, and 204A and the stack of layers 202B, 203B, and 204B can provide an inverse spin orbit coupling (ISOC) effect (e.g., an inverse Rashba-Edelstein effect (or inverse spin Hall effect (ISHE)). As shown in FIG. 2B and FIG. 2C, the stack of layers 202, 203, and 204 (which represents the stack of layers 202A, 203A, and 204A and the stack of layers 202B, 203B, and 204B) can provide spin-to-charge conversion where a spin current $I_s$ (or spin energy $J_s$) can be injected from magnet 201 and charge current $I_c$ can be generated by the stack of layers (e.g., stack of layers 202A, 203A, and 204A). This charge current $I_c$ can be provided to conductor 205. In contrast to spin current, charge current does not attenuate in conductor 205. The direction of the charge current $I_c$ depends on the direction of magnetization of magnet 201.

Charge current $I_c$ charges the capacitor around ME layer 206A and switches its polarization. ME layer 206A exerts exchange bias on magnet 207, and the direction of the exchange bias determines the magnetization of magnet 207. The same dynamic occurs at ME layer 206B, which exerts exchange bias on magnet 201 according to an input charge current on conductor 211A.

Each of magnets 201 and 207 can have a thickness $t_c$. Magnets 201 and 207 can have widths $W_{m1}$ and $W_{m2}$, respectively. Each of magnets 201 and 207 can have a length (not labeled) perpendicular to its respective width. Each of ME layers 206A and 206B can have a thickness (e.g., thickness $t_{ME}$ shown in FIG. 2A).

As shown in FIG. 2A, current $I_{CHARGE(IN)}$ (e.g., an input charge current) is provided on conductor 211A. Current $I_{CHARGE(IN)}$ is also called $I_{IN}$ in this description. Conductor 211A can be coupled to magnet 201 through ME layer 206B and can be perpendicular to magnet 201. For example, conductor 211A can extend in the x-direction and magnet 201 can extend in the y-direction, which is perpendicular to the x-direction. Current $I_{CHARGE(IN)}$ is converted to a corresponding magnetic polarization of magnet 201 by ME layer 206B. The materials for ME layers 206A and 206B can be the same as the materials of ME layer 206.

As shown in FIG. 2A, conductor 211B can provide current $I_{CHARGE(OUT)}$ (or $I_{OUT2}$) to another logic or stage. Conductor 211B can be coupled to magnet 207 through the stack of layers 202B, 203B, and 204B that exhibit at least one of the spin Hall effect and the Rashba-Edelstein effect. Layers 202B, 203B, and 204B can be formed from the same material as layers 202A, 203A, and 204A, respectively.

ME layers 206A and 206B can form a respective magnetoelectric capacitor to switch magnets 201 and 207, respectively. For example, conductor 205 can form one plate of the capacitor, magnet 207 can form the other plate of the capacitor, and ME layer 206A can form a magnetoelectric oxide that provides out-of-plane exchange bias to magnet 207. The magnetoelectric oxide can include perpendicular exchange bias due to partially compensated anti-ferromagnetism.

Magnet 201 can inject a spin-polarized current into the high spin-orbit coupling (SOC) material stack (e.g., stack of layers 202A, 203A, and 204A). The spin polarization is determined by the magnetization of magnet 201.

The SOC material stack can include an interface (e.g., layer 203A or 203B) with a high-density two-dimensional (2D) electron gas and with high SOC formed between layers 202A and 204A (or between layers 202B and 204B) that can include materials such as Ag or Bi. The SOC material stack can include a bulk material (e.g., layer 204) with a high Spin Hall Effect (SHE) coefficient such as Ta, W, or Pt.

A spacer (or template layer) can be formed between magnet 201 and the injection stack. The spacer can be a templating metal layer which provides a template for forming magnet 201. The metal of the spacer, which can be directly coupled to magnet 201, can be a noble metal (e.g., Ag, Cu, or Au) doped with other elements from Group 4d or 5d, or both, of the Periodic Table. Magnet 201 (and by extension contact 209A or semi-insulating magnet 209A) is sufficiently lattice matched to Ag (e.g., is a material which is engineered to have a lattice constant close to (e.g., within 3% of) that of Ag).

Here, sufficiently matched atomistic crystalline layers refer to matching of the lattice constant a within a threshold level above which atoms exhibit dislocation which is harmful to the device (for instance, the number and character of dislocations lead to a significant (e.g., greater than 10%) probability of spin flip while an electron traverses the interface layer). For example, the threshold level may be within 5% (i.e., threshold levels in the range of 0% to 5% of the relative difference of the lattice constants). As the matching improves (i.e., gets closer to perfect matching), spin injection efficiency from spin transfer from magnet 201 to the ISHE/ISOC stacked layer increases. Poor matching (e.g., matching worse than 5%) implies dislocation of atoms that is harmful for the device.

Table 1 summarizes transduction mechanisms for converting magnetization to charge current and charge current to magnetization for bulk materials and interfaces.

TABLE 1

Transduction mechanisms for Spin-to-Charge and Charge-to-Spin Conversion

|  | Spin → Charge | Charge → Spin |
| --- | --- | --- |
| Bulk | Inverse Spin Hall Effect | Magnetoelectric effect |
| Interface | Inverse Rashba-Edelstein Effect | Magnetoelectfic effect |

As shown in FIG. 2A, MESO logic 200 can include transistors M1 and M2. FIG. 2A shows an example where each of transistors M1 and M2 includes an n-type metal-oxide semiconductor (MOS) field-effect transistor (FET) (n-type MOSFET). However, each of transistors M1 and M2 can include a p-type MOSFET. Further, FIG. 2A shows transistors M1 and M2 having the same conductivity type (e.g., n-type) as an example. However, transistors M1 and M2 can be of different types. For example, transistor M1 can be a p-type transistor and transistor M2 can be an n-type transistor, or transistor M1 can be an n-type transistor and transistor M2 can be a p-type transistor. Moreover, transistors M1 and M2 can be transistors different from MOSFETs.

As shown in FIG. 2A, transistor M1 can include a terminal (e.g., a drain) coupled to a node 291, a terminal (e.g., a source) coupled to a node 292, and a gate to receive a signal VG. Signal VG can be used to control (e.g., turn on or turn off) transistor M1. Signal VG can include a non-clock signal (e.g., not a clock signal (e.g., a non-periodical signal)). A non-clock signal can include signals that exclude clock signals. Thus, transistor M1 can be turned on and turned off in a non-periodical fashion. An example of signal VG includes a power gating signal.

Transistor M2 can include a terminal (e.g., a source) coupled to a node 290, a terminal (e.g., a drain) coupled to a node 293, and a gate to receive a signal VG (which can be the same signal provided to the gate of transistor M1). Signal VG can be used to control (e.g., turn on or turn off) transistor M2, which can be turned on and turned off in a non-periodical fashion.

As shown in FIG. 2A, node 291 can receive a voltage $V_{DD}$, which can include a supply voltage of a device (e.g., an IC) or system that includes MESO logic 200. Thus node 291 in FIG. 2A can include a supply node (e.g., a positive voltage supply connection). Node 290 can be coupled to another supply node (e.g., ground connection).

Node 292 can be coupled to the stack of layers 202A, 203A, and 204A through contact 209A and coupled to the stack of layers 202B, 203B, and 204B through contact 209B. Thus, transistor M1 can include a terminal (e.g., source) coupled to the stack of layers 202A, 203A, and 204A through contact 209A and coupled to the stack of layers 202B, 203B, and 204B through contact 209B. Transistor M1 can operate to couple the stack of layers 202A, 203A, and 204A to node 291 (through contact 209A) and couple stack of layers 202B, 203B, and 204B to node 291 (through contact 209B).

Node 293 can be coupled to the stack of layers 202A, 203A, and 204A (e.g., coupled to layer 204A) and coupled to the stack of layers 202B, 203B, and 204B (e.g., coupled to layer 204B). Thus, transistor M2 can include a terminal (e.g., drain) coupled to the stack of layers 202A, 203A, and 204A (e.g., coupled to layer 204A) and coupled to the stack of layers 202B, 203B, and 204B (e.g., coupled to layer 204B). Transistor M2 can operate to couple the stack of layers 202A, 203A, and 204A to node 290 (through layer 204A) and couple stack of layers 202B, 203B, and 204B to node 290 (through layer 204B).

As shown in FIG. 2A, MESO logic 200 can include conductive paths 294 and 295. Each of conductive paths 294 and 295 can include a conductive material that can conduct (e.g., carry) current (e.g., part of current $I_{DRIVE}$). Example materials for conductive paths 294 and 295 include metal, alloy, or other conductive materials.

As shown in FIG. 2A, conductive path 294 can be coupled to a portion of magnet 201 through contact 209A and to a portion of magnet 207 through contact 209B. Contacts 209A and 209B can be formed from any suitable conductive material used to connect transistor M1 to magnets 201 and 207. Thus, a portion of magnet 201 and a portion of magnet 207 can be coupled to each other (e.g., through conductive path 294 and contacts 209A and 209B). Current $I_{DRIVE}$ from transistor M1 can generate spin current into the stack of layers 202A, 203A, and 204A and the stack of layers 202B, 203B, and 204B through conductive path 294.

As shown in FIG. 2A, conductive path 295 can be coupled to a portion of magnet 201 through layer 204A and to a portion of magnet 207 through layer 204B. Thus, a portion of magnet 201 and a portion of magnet 207 can be coupled to each other (e.g., through conductive path 295). Transistor M2 can operate to couple layer 204A of the stack of layers 202A, 203A, and 204A to ground, and to couple layer 204B of the stack of layers 202B, 203B, and 204B to ground.

Thus, as shown in FIG. 2A, a SOC stack including layers 202A, 203A, and 204A and a SOC stack including layers 202B, 203B, and 204B are coupled in parallel with each other between nodes 292 and 293. Transistors M1 and M2 are coupled in series with magnet 201 and the SOC stack including layers 202A, 203A, and 204A between node 291 (e.g., a supply node) and node 290 (e.g., ground). Transistors M1 and M2 are also coupled in series with magnet 207 and the SOC stack including layers 202B, 203B, and 204B.

As shown in FIG. 2A, MESO logic 200 can include two MESO devices 231 and 232. MESO device 231 can include components (e.g., layers) from conductor 211A to the left of conductor 205. MESO device 232 can include components (e.g., layers) from conductor 205 to conductor 211B to the right. An ideal unidirectional signal propagation scenario is as follows: an input charge current (e.g., $I_{CHARGE(IN)}$) drives magnet 201 while a current $I_{DRIVE}$ (e.g., a drive charge current or supply charge current) is injected into the first SOC stack (layers 202A, 203A, and 204A). Magnet 201 switches magnetization, and its directionality determines the direction of current $I_{OUT1}$ (e.g., an output charge current) in conductor 205. Current $I_{OUT1}$ of MESO device 231 drives MESO device 232, which continues to switch the MESO of MESO device 232.

The polarization direction of the ferroelectric charge in the magnet stack determines the magnetic directions of magnets 201 and 207, which determines the output current direction. In this example, in MESO device 231, current $I_{CHARGE(IN)}$ from input conductor 211A induces positive polarization charge on the bottom plate of the ferroelectric capacitor included in ME layer 206B and results in polarization of magnet 201. With current $I_{DRIVE}$ (or charge supply current $I_{SUPPLY}$) from contact 209A to layer 204A, current $I_{OUT1}$ is generated on conductor 205 and is inverted from the input. Current $I_{OUT1}$ then provides input current to MESO device 232. This current induces a negative polarization charge on the bottom plate of the ferroelectric capacitor included in ME layer 206A of MESO device 232. This polarization charge causes magnet 207 of MESO device 232 to switch magnetization, which results in current $I_{OUT2}$ (e.g., an output charge current) to be in the same direction as current $I_{CHARGE(IN)}$ (with the same $I_{SUPPLY}$ current direction).

The following section describes the spin-to-charge and charge-to-spin dynamics. In some examples, the spin-orbit mechanism responsible for spin-to-charge conversion is described by the inverse Rashba-Edelstein effect in 2D electron gases. The Hamiltonian (energy) of spin-orbit coupling electrons in a 2D electron gas is:

$$H_R = \alpha_R (k \times \hat{z}) \cdot \vec{\sigma}$$

where $\alpha_R$ is the Rashba-Edelstein coefficient, k is the operator of momentum of electrons, $\hat{z}$ is a unit vector perpendicular to the 2D electron gas, and $\vec{\sigma}$ is the operator of spin of electrons.

The spin-polarized electrons with direction of polarization in-plane (e.g., in the x-y plane) experience an effective magnetic field dependent on the spin direction:

$$B(k) = \frac{\alpha_R}{\mu_B}(k \times \hat{Z})$$

where $\mu_B$ is the Bohr magneton.

This results in the generation of a charge current $I_c$ in conductor 205 proportional to the spin current $I_s$ (or $J_s$). The spin-orbit interaction by Ag and Bi of layers 202 and 204 (e.g., the Inverse Rashba-Edelstein Effect (IREE)) produces a charge current $I_c$ in the horizontal direction given as:

$$I_c = \frac{\lambda_{IREE} I_s}{w_m}$$

where $w_m$ is the width of magnet 201 (e.g., the input magnet), and $\lambda_{IREE}$ is the IREE constant (with units of length) proportional to $\alpha_R$.

Alternatively, the Inverse Spin Hall Effect in Ta, W, or Pt of layer 203A (or 203B) produces the horizontal charge current given as:

$$I_c = \frac{\Theta_{SHE} t_{SHE} I_s}{2 w_m}$$

where $\Theta_{SHE}$ and $t_{SHE}$ are the spin Hall angle and the thickness of the layer 203A (or 203B). Both IREE and ISHE effects produce spin-to-charge current conversion around 0.1 with existing materials at 10 nm magnet width. For scaled nanomagnets (e.g., 5 nm wide magnets) and exploratory SHE materials such as $Bi_2Se_3$, the spin-to-charge conversion efficiency can be between 1 and 2.5. The net conversion of the current $I_{DRIVE}$ to magnetization-dependent charge current is given as:

$$I_c = \pm \frac{\lambda_{IREE} P I_s}{w_m}$$

for IREE and $$I_c = \pm \frac{\Theta_{SHE} t_{SHE} P I_s}{2 w_m}$$

for ISHE where P is the dimensionless spin polarization. For this estimate, current $I_{DRIVE}$ and the charge current $I_c = I_d = 100 \mu A$ is set. As such, when estimating the resistance of the ISHE interface to be equal to $R=100\Omega$, then the induced voltage is equal to $V_{ISHE}=10$ mV.

The charge current $I_c$, carried by conductor 205, produces a voltage on the capacitor of ME layer 206A comprising a magnetoelectric material dielectric (such as $BiFeO_3$ (BFO) or $Cr_2O_3$) in contact with magnet 207 (which serves as one of the plates of the capacitor) and conductor 205 (which serves as the other of the plates of the capacitor). Magnetoelectric materials can be either intrinsic multiferroic or composite multiferroic structures. As the charge accumulates on the magnetoelectric capacitor of ME layer 206A, a strong magnetoelectric interaction causes the switching of magnetization in magnet 207 (and by extension contact 209B or semi-insulating magnet 209B).

Assume the following parameters of the magnetoelectric capacitor: thickness $T_{ME}=5$ nm, dielectric constant $\varepsilon=500$, area A=60 nm×20 nm. Then the capacitance is given as:

$$C = \frac{\varepsilon \varepsilon_0 A}{t_{ME}} \approx 1 fF$$

The demonstrated value of the magnetoelectric coefficient is $\alpha_{ME} \sim 10/c$, where c is the speed of light. This translates to the effective magnetic field exerted on semi-insulating magnet 207, which is expressed as:

$$B_{ME} = \alpha_{ME} E = \frac{\alpha_{ME} V_{ISHE}}{t_{ME}} \sim 0.06 \text{ T}$$

This is a strong field sufficient to switch magnetization.

The charge on the capacitor of ME layer 206A is $$Q = \frac{1}{fF} \times 10 \text{ mV} = 10 \text{ aC}$$

and the time to fully charge it to the induced voltage is $$td = 10\frac{Q}{I_d} \sim 1 \text{ ps}$$

(with the account of decreased voltage difference as the capacitor charges). If the driving voltage is $V_d$=100, then the energy $E_{SW}$ to switch magnetization is expressed as:

$E_{sw}$~100 mV×100 µA×1 ps~10 aJ which is comparable to the switching energy of complementary metal oxide semiconductor (CMOS) transistors. Note that the time to switch magnetization $t_w$ remains much longer than the charging time and is determined by the magnetization precession rate. The micro-magnetic simulations predict this time to be $t_w$~100, for example.

Materials for magnets 201 and 207 have saturated magnetization $M_s$ and effective anisotropy field $H_k$. Saturated magnetization $M_s$ is generally the state reached when an increase in an applied external magnetic field H cannot increase the magnetization of the material. Anisotropy $H_k$ generally refers to material properties that are highly directionally dependent.

Materials for magnets 201 and 207 can include non-ferromagnetic elements with strong paramagnetism which have a high number of unpaired spins but are not room-temperature ferromagnets. A paramagnet, as opposed to a ferromagnet, exhibits magnetization when a magnetic field is applied to it. Paramagnets generally have magnetic permeability greater than or equal to one and hence are attracted to magnetic fields. Magnets 201 and 207 can include a material which includes at least one of platinum (Pt), palladium (Pd), tungsten (W), cerium (Ce), aluminum (Al), lithium (Li), magnesium (Mg), sodium (Na), $Cr_2O_3$ (chromium oxide), CoO (cobalt oxide), dysprosium (Dy), $Dy_2O$ (dysprosium oxide), erbium (Er), $Er_2O_3$ (erbium oxide), europium (Eu), $Eu_2O_3$ (europium oxide), gadolinium (Gd), gadolinium oxide ($Gd_2O_3$), FeO and $Fe_2O_3$ (iron oxide), neodymium (Nd), $Nd_2O_3$ (neodymium oxide), $KO_2$ (potassium superoxide), praseodymium (Pr), samarium (Sm), $Sm_2O_3$ (samarium oxide), terbium (Tb), $Tb_2O_3$ (terbium oxide), thulium (Tm), $Tm_2O_3$ (thulium oxide), and $V_2O_3$ (vanadium oxide).

Magnets 201 and 207 can include paramagnets that can include dopants selected from at least one of Ce, Cr, Mn, Nb, Mo, Tc, Re, Nd, Gd, Tb, Dy, Ho, Er, Tm, and Yb.

Magnets 201 and 207 can include ferromagnets that can include at least one of a Heusler alloy, Co, Fe, Ni, Gd, B, Ge, Ga, a permalloy, and yttrium iron garnet (YIG). The Heusler alloy is a material which includes at least one of Cu, Mn, Al, In, Sn, Ni, Sb, Ga, Co, Fe, Si, Pd, Sb, V, Ru, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$ $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, MnGaRu, and $Mn_3X$, where 'X' is one of Ga and Ge.

In the stack of layers providing spin orbit coupling, layer 202A (or layer 202B) can include Ag, layer 204A (or 204B) can include Bi or W, and layer 203A (or 203B) can include at least one of Ta, W, and Pt. Alternatively, the stack of layers can include a material which includes at least one of β-Ta, β-W, W, Pt, Cu doped with iridium, Cu doped with bismuth, and Cu doped with an element of 3d, 4d, 5d, 4f, or 5f of periodic table groups.

ME layer 206A (or 206B) can include one of $Cr_2O_3$ and a multiferroic material, or Cr and O. The multiferroic material can include BFO (e.g., $BiFeO_3$), LFO ($LuFeO_2$, $LuFe_2O_4$), or La-doped $BiFeO_3$. Alternatively, the multiferroic material can include one of Bi, Fe, O, Lu, and La. ME layer 206A (or 206B) can alternatively include one of a dielectric, paraelectric, and ferroelectric material.

Contact 209A can be replaced with a semi-insulating magnet, and contact 209B can be replaced with a semi-insulating magnet. Thus, contacts 209A and 209B can be semi-insulating magnets 209A and 209B, respectively. As shown in FIG. 2A, semi-insulating magnet 209A can be adjacent (e.g., contact) magnet 201 and can be coupled to transistor M1. Thus, semi-insulating magnet 209A can function as a displacement capacitor between transistor M1 and magnet 201. Here the term "semi-insulating magnet" generally refers to a material that has magnetic properties but has higher resistivity compared to normal ferromagnets. For example, semi-insulating or insulating magnets may not be conductive for charge current, but exhibit magnetic properties. The semi-insulating magnet or insulating magnet may have a Spinel crystal structure, can be hexagonal (e.g., $Fe_2O_3$), or can belong to any of the crystal classes. The semi-insulating or insulating magnets can include one of $Fe_2O_3$, $Co_2O_3$, $Co_2FeO_4$, and $Ni_2FeO_4$. Elements for semi-insulating or insulating magnets can include at least one of Fe, O, Co, and Ni. The direction of current $I_c$ (charge current) also depends on the direction of magnetization of semi-insulating magnet 209A.

As described above, contacts 209A and 209B can be replaced with semi-insulating magnets 209A and 209B, respectively, and can form displacement capacitors. The nature of the displacement capacitor may be set by the leakage and the dielectric constants of semi-insulating magnets 209A and 209B. Semi-insulating magnets 209A and 209B can form dielectric capacitors where a bound charge is generated at the plates.

Semi-insulating magnets 209A and 209B can include at least one of Co, Fe, No, and O, or at least one of $Co_2O_3$, $Fe_2O_3$, $Co_2FeO_4$, and $Ni_2FeO_4$. Semi-insulating magnets 209A and 209B can have a Spinel crystal structure or noninsulating properties. For example, semi-insulating magnets 209A and 209B can be paramagnets or ferromagnets.

The magnetization of semi-insulating magnet 209A is determined by the magnetization of magnet 201. For example, when magnet 201 has a magnetization pointing in the −y-direction, then semi-insulating magnet 209A has a magnetization pointing in the −y-direction. The magnetization of semi-insulating magnet 209B is determined by the magnetization of magnet 207. For example, when magnet 207 has a magnetization pointing in the y-direction, then semi-insulating magnet 209B has a magnetization pointing in the y-direction. Semi-insulating magnet 209B can be adjacent (e.g., contact) magnet 207 such that magnet 207 is between semi-insulating magnet 209B and the stack of layers providing spin orbit coupling.

Figure 3:
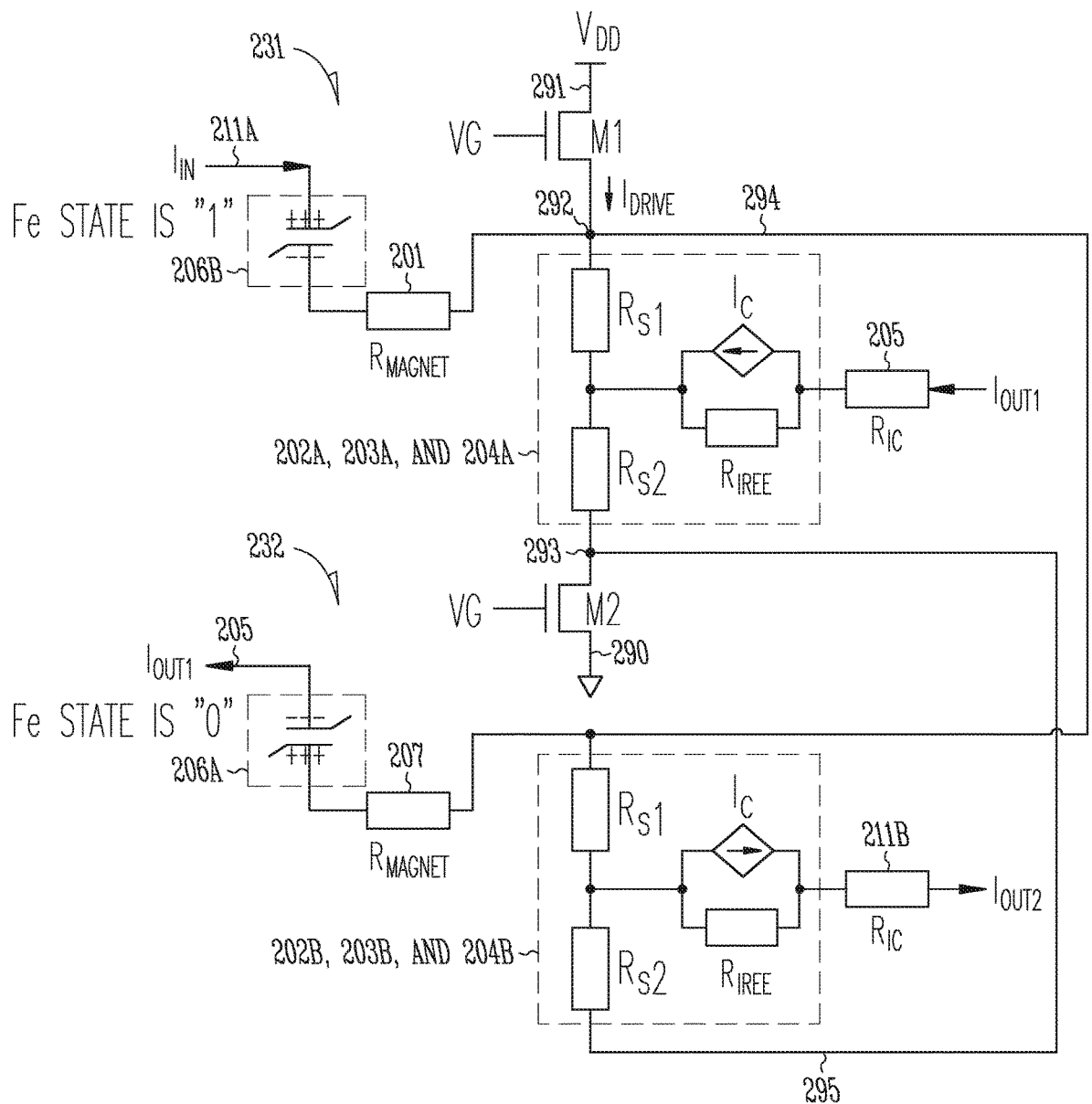
FIG. 3 shows an equivalent circuit model for the MESO logic of FIG. 2A, according to some embodiments described herein.

FIG. 3 shows an equivalent circuit model for MESO logic 200 of FIG. 2A, according to some embodiments described herein. The same reference numbers (or names) between FIG. 2A and FIG. 3 indicate the same elements of MESO logic 200. As shown in FIG. 3, MESO devices 231 and 232 of MESO logic 200 can be coupled in a cascaded fashion, such that the output node (e.g., node coupled to conductor 205) of MESO device 231 is coupled to the input node (e.g., node at a plate of the ferroelectric capacitor included in ME layer 206A) of MESO device 232.

In MESO device 231 of FIG. 3, $R_{MAGNET}$, the combination of $R_{s1}$ and $R_{s2}$, $R_{IREE}$, and $R_{IC}$ are the modeled resistances for magnet 201, the SOC stack (e.g., layers 202A, 203A, 204A) shunt resistance, the Inverse Rashba-Edelstein Effect (IREE) resistance, and the resistance of conductor 205, respectively. The IREE effect from the current in the SOC stack (e.g., layers 202A, 203A, 204A) can be modeled as a current-controlled current source, of which the current direction is determined by the magnet "state" (e.g., the nanomagnet direction, which is inconsistent with the polarization charge in the ferroelectric). The ferroelectric capacitor included in ME layer 206B can be modeled as a non-linear capacitor using Landau Khalatnikov (LK) equations.

In MESO device 232 of FIG. 3, $R_{MAGNET}$, the combination of $R_{s1}$ and $R_{s2}$, $R_{IREE}$, and $R_{IC}$ are the modeled resistances for magnet 207, the SOC stack (e.g., layers 202B, 203B, 204B) shunt resistance, the Inverse Rashba-Edelstein Effect (IREE) resistance, and the resistance of conductor 211B, respectively. The IREE effect from the current in the SOC stack (e.g., layers 202B, 203B, 204B) can be modeled as a current-controlled current source, of which the current direction is determined by the magnet "state" (e.g., the nanomagnet direction, which is inconsistent with the polarization charge in the ferroelectric). The ferroelectric capacitor included in ME layer 206A can be modeled as a non-linear capacitor using LK equations.

Figure 4B:
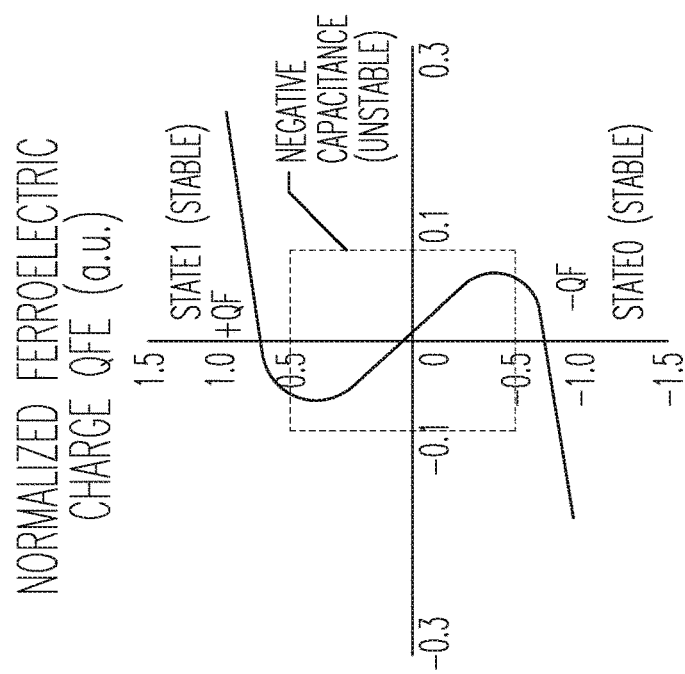
FIG. 4A and FIG. 4B show a ferroelectric Landau Khalatnikov (LK) model and corresponding plot showing two ferroelectric states.
Figure 4A:
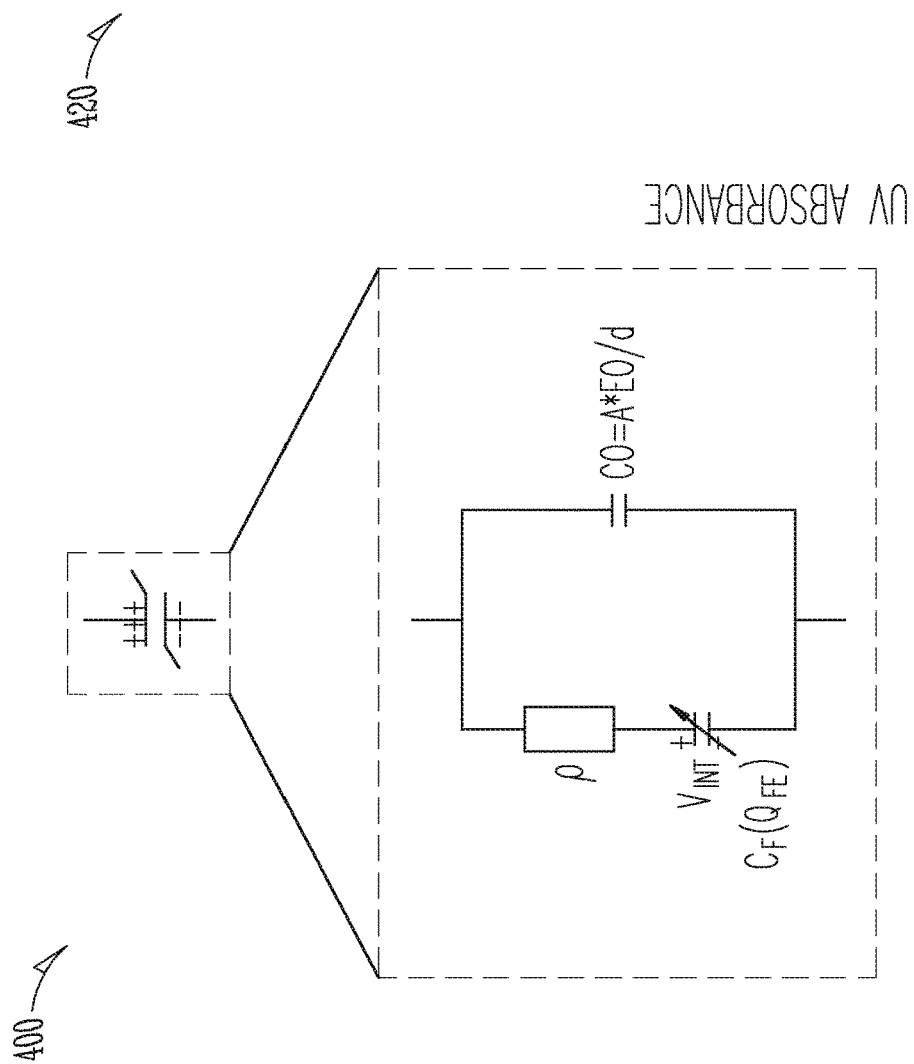

FIG. 4A and FIG. 4B show a ferroelectric Landau Khalatnikov (LK) model 400 and corresponding plot 420 showing two ferroelectric states. As shown in FIG. 4B, positive polarization charge +QF can correspond to state '1' of the magnet, and negative polarization charge −QF can correspond to state '0' of the magnet. Here, normalized +QF(1) and −QF(−1) are used in a circuit simulation to indicate the ferroelectric states.

LK model 400 illustrates a circuit that provides ferroelectric voltage (e.g., VFE) and includes capacitor C0 in parallel with a series-coupled resistance p and internal capacitance $C_F(Q_{FE})$ that provides internal voltage $V_{INT}$. Here, A is the area of capacitor C0, d is the distance between the plates of capacitor C0, and E0 is the dielectric constant. Plot 420 shows the capacitance behavior of a ferroelectric capacitor (FE-Cap) when connected with a load capacitor. Here, the x axis is the internal voltage $V_{INT}$ in volts, and the y axis is charge from the ferroelectric capacitor when connected with a load capacitor. The dotted region in plot 420 represents the negative capacitance region between the coercive voltage bounds.

When a voltage source drives the FE-Cap connected with a load capacitor, the operating region of the FE-Cap is biased by the load capacitance. When the FE-Cap is biased at the negative capacitance region (e.g., the charge on the FE-cap is positive while the voltage across the FE-cap is negative, and vice versa), the voltage across the load capacitance can be higher than the input voltage, owing to the ferroelectric-polarity-charge-induced voltage amplification effect. On the other hand, when the FE-Cap is biased at the positive capacitance region, it operates as a regular capacitor. The negative capacitance effect has been mainly used for transistor gate stack enhancement (e.g., negative-capacitance FETs) for low-voltage transistors. The concept of negative capacitance in a MESO logic can be used to enhance the switching of magnets via the magnetoelectric layer.

Figure 5A:
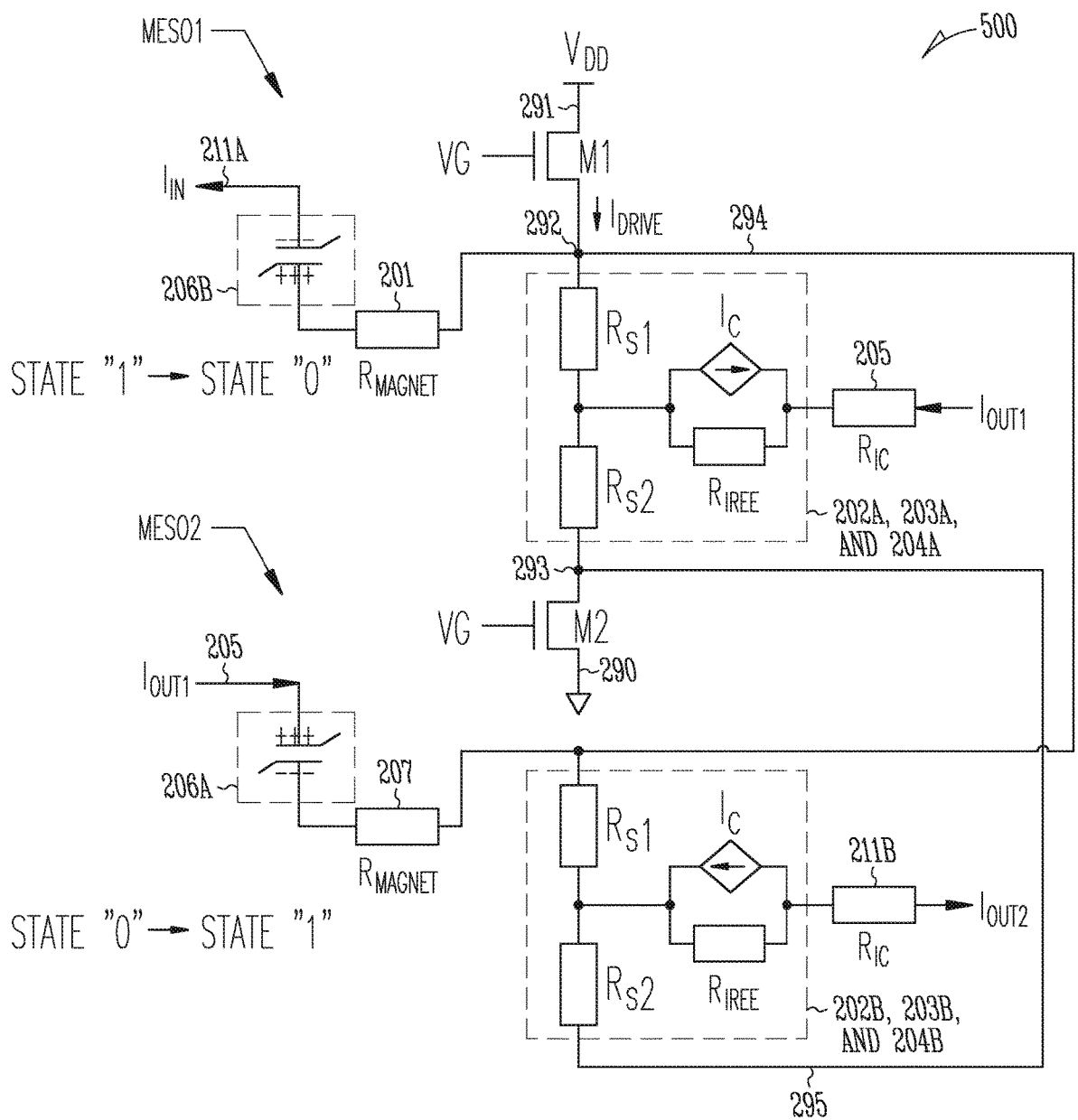
FIG. 5A shows a combinatorial MESO logic including MESO devices and examples of MESO state changes, according to some embodiments described herein.
Figure 5B:
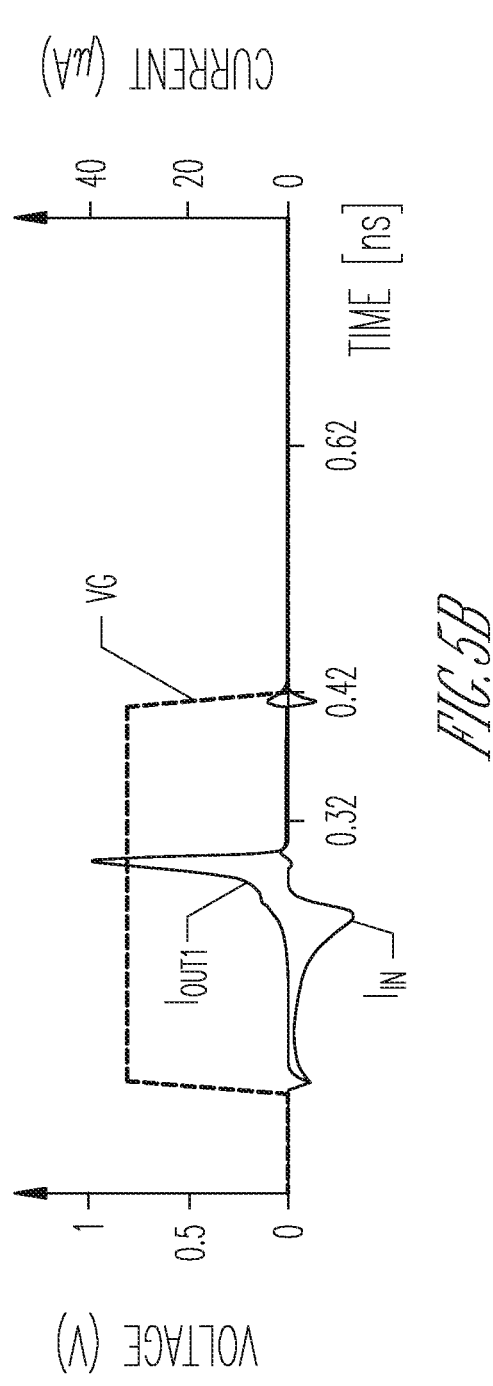
FIG. 5B is a waveform diagram for currents in the MESO devices of the combinatorial MESO logic of FIG. 5A, according to some embodiments described herein.
Figure 5C:
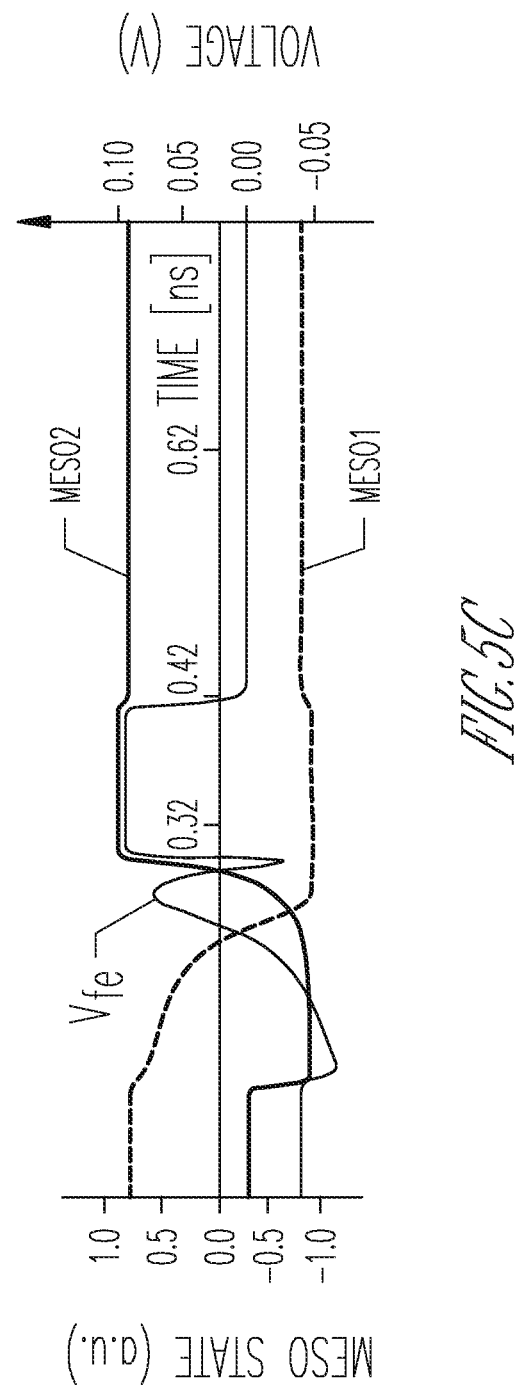
FIG. 5C shows switching of states of MESO devices of the combinatorial MESO logic of FIG. 5A, according to some embodiments described herein.

FIG. 5A shows combinatorial MESO logic 500 including MESO devices MESO1 and MESO2, according to some embodiments described herein. FIG. 5B is a waveform diagram for currents in MESO1 and MESO2 devices of combinatorial MESO logic 500 of FIG. 5A, according to some embodiments described herein. FIG. 5C shows switching of states of MESO1 and MESO2 devices of combinatorial MESO logic 500 of FIG. 5A, according to some embodiments described herein.

Combinatorial MESO logic 500 can have the same structure as MESO logic 200 described above with reference to FIG. 2A through FIG. 4. For example, MESO1 and MESO2 devices of FIG. 5A can have the structures of MESO devices 231 and 232 (FIG. 2A), respectively. Thus, detailed description of the MESO devices (e.g., MESO1 and MESO2) of combinatorial MESO logic 500 is omitted. The following description describes the operation of combinatorial MESO logic 500. Voltage values, current values, time values, and other specific values used in this description and shown in the drawings are example values. Other values may be used.

The description with reference to FIGS. 5A-5C shows an example where MESO1 device changes from state "1" (e.g., an initial state) to state "0", and MESO2 device changes from an initial state "0" to state "1" based on changes in injected input current (e.g., $I_{IN}$) and signal VG having a value that turns on transistors M1 and M2. In FIGS. 5A-5C, voltage $V_{DD}$ (e.g., a supply voltage) can have an example value of 100 mV, and signal VG can be provided with an example voltage of 0.8V or ground (e.g., 0V). As described above, signal VG can be a non-clock (e.g., non-periodical) signal. Signal VG can be used to turn on transistors M1 and M2 to provide power (e.g., voltage $V_{DD}$ and current) to combinatorial MESO logic 500 (e.g., to turn on combinatorial MESO logic 500). Signal VG can be used to turn off transistors M1 and M2 to disconnect power (e.g., voltage $V_{DD}$) from combinatorial MESO logic 500. For example, combinatorial MESO logic 500 can be powered on (e.g., turned on) when signal VG is provided with a voltage of 0.8V (which can turn on transistors M1 and M2). Combinatorial MESO logic 500 can be powered off (e.g., turned off) when signal VG is provided with 0V (e.g., ground) that can turn off transistors M1 and M2. MESO1 and MESO2 devices can remain at their respective initial states (e.g., present states) when transistors M1 and M2 are turned on (e.g., when combinatorial MESO logic 500 is powered on) and no input current is injected into conductor 211A (e.g., $I_{IN}$ is zero).

As shown in FIG. 5B, when a discharging current IN is injected into MESO1 device, the ferroelectric charge of MESO1 $C_{FE}$ (in ME layer 206B in FIG. 5A) switches from +Q to −Q, and the MESO1 state changes from "1" (e.g., initial state) to "0" (FIG. 5C). The switching of MESO1 device generates a positive output current (current $I_{OUT1}$) in resistance $R_{IC}$ of MESO1 device. Then, current $I_{OUT1}$ injects to input $C_{FE}$ (e.g., in ME layer 206A in FIG. 5A) of MESO2 device. This causes the ferroelectric charge of MESO2 $C_{FE}$ (in ME layer 206A in FIG. 5A) to switch from −Q to +Q, and the MESO2 state changes from "0" (e.g., initial state) to "1" (FIG. 5C). FIG. 5C also shows a voltage Vfe, which is the voltage across $C_{FE}$ of MESO2 device, indicating the signature ferroelectric switching.

Figure 6A:
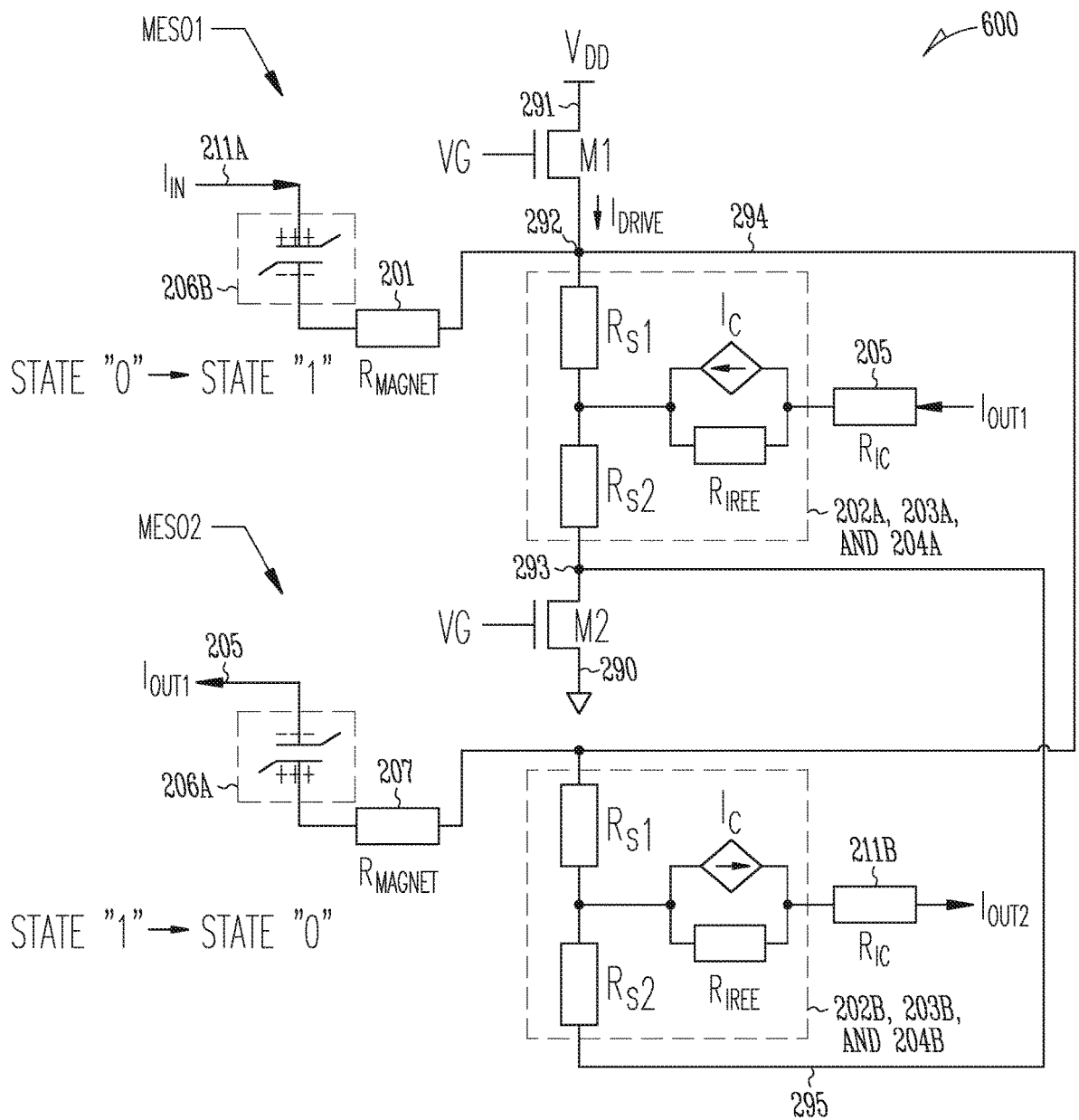
FIG. 6A shows another combinatorial MESO logic including MESO devices and examples of MESO state changes, according to some embodiments described herein.
Figure 6B:
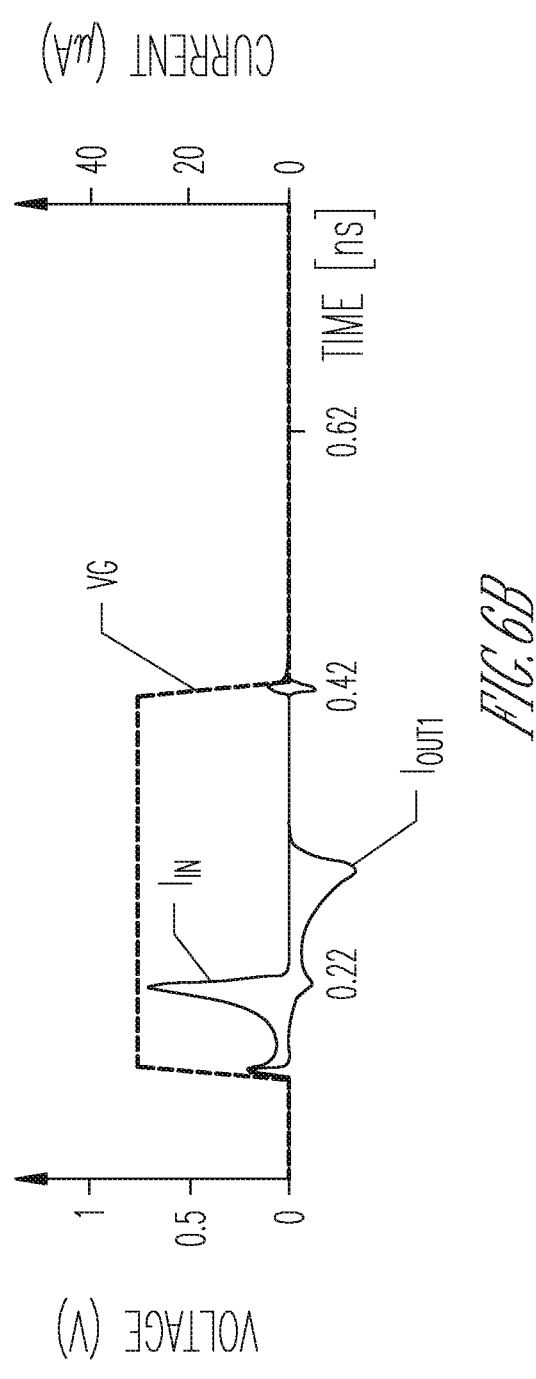
FIG. 6B is a waveform diagram for currents in the MESO devices of the combinatorial MESO logic of FIG. 6A, according to some embodiments described herein.
Figure 6C:
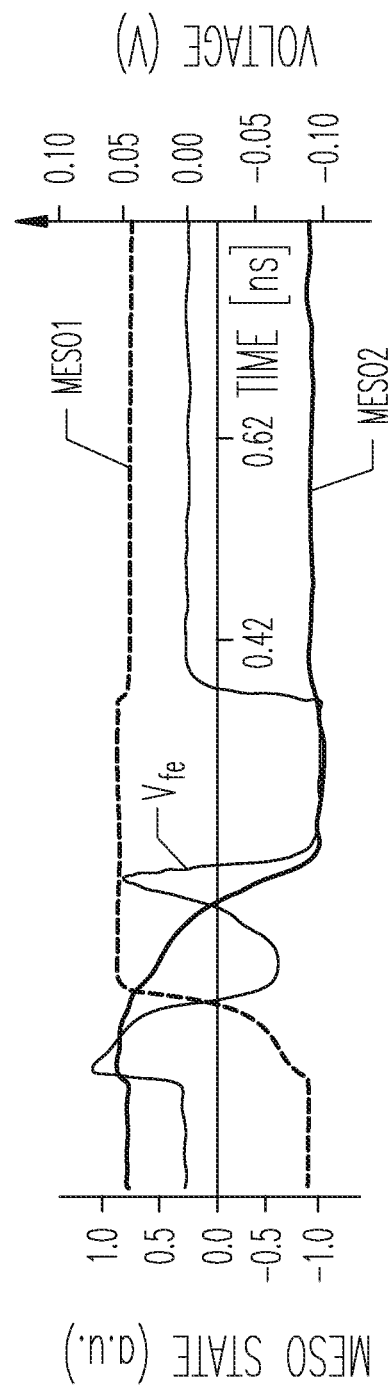
FIG. 6C shows switching of states of MESO devices of the combinatorial MESO logic of FIG. 6A, according to some embodiments described herein.

FIG. 6A shows combinatorial MESO logic 600 including MESO devices MESO1 and MESO2, according to some embodiments described herein. FIG. 6B is a waveform diagram for currents in MESO1 and MESO2 devices of combinatorial MESO logic 600 of FIG. 6A, according to some embodiments described herein. FIG. 6C shows switching of states of MESO1 and MESO2 devices of combinatorial MESO logic 600 of FIG. 6A, according to some embodiments described herein.

Combinatorial MESO logic 600 has the same structure as MESO logic 200 described above with reference to FIG. 2A through FIG. 4. For example, MESO1 and MESO2 devices of FIG. 6A can have the structures of MESO devices 231 and 232 (FIG. 2A), respectively. Thus, detailed description of the MESO devices (e.g., MESO1 and MESO2) of combinatorial MESO logic 600 is omitted. The following description describes the operation of combinatorial MESO logic 600.

Differences between FIGS. 5A-5C and FIGS. 6A-6C include different initial MESO states between MESO1 and MESO1 devices of FIG. 5A and FIG. 6A and different initial MESO states between MESO2 and MESO2 devices of FIG. 5A and FIG. 6A and different input current polarity to MESO1 device. For example, FIGS. 6A-6C show MESO1 device switching from an initial state "0" to state "1", and MESO2 device switching from an initial state "1" to state "0". As shown in FIG. 6B, when a positive current $I_{IN}$ is injected into MESO1 device, the ferroelectric charge of MESO1 $C_{FE}$ (in ME layer 206B in FIG. 6A) switches from −Q to +Q, and the MESO1 state changes from "0" (e.g., initial state) to "1" (FIG. 6C). The switching of MESO1 device generates a negative output current (current $I_{OUT1}$) in resistance $R_{IC}$ of MESO1 device. Then, current $I_{OUT1}$ injects to input $C_{FE}$ (e.g., in ME layer 206A in FIG. 6A) of MESO2 device. This causes the ferroelectric charge of MESO2 (CF in ME layer 206A in FIG. 6A) to switch from +Q to −Q, and the MESO2 state changes from "1" (e.g., initial state) to "0" (FIG. 6C). FIG. 6C also shows a voltage Vfe, which is the voltage across CF of MESO2 device, indicating the signature ferroelectric switching.

Thus, as described above with reference to FIG. 2A through FIG. 6C, the MESO logic switching and state propagation is triggered by the input current (e.g., current $I_{IN}$) instead of a periodical signal (e.g., a clock signal). Therefore, a clock signal may be excluded from (e.g., may not be needed by) the MESO logic (e.g., MESO logic 200, 500, and 600) described above. Hence the combinatorial logic behavior can be achieved (e.g., as shown in the example of FIGS. 5A-5C and FIGS. 6A-6C). Moreover, transistors (e.g., M1 and M2) in the combinatorial MESO logic described above can be shared among MESO stages. Thus, the peripheral components (e.g., complementary metal oxide semiconductor (CMOS) transistors) overhead can be reduced.

Figure 7A:
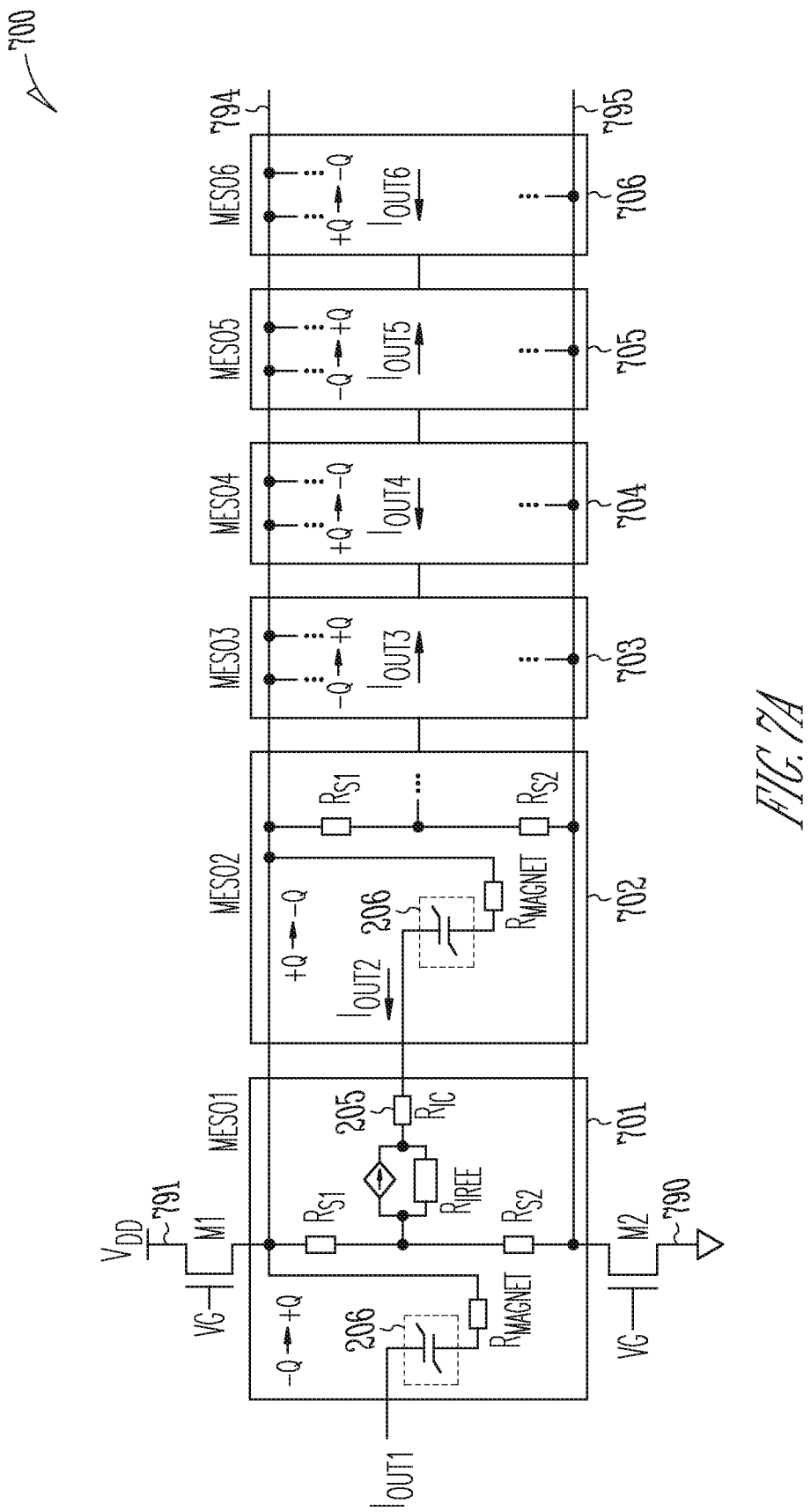
FIG. 7A shows a combinatorial MESO logic including stages having MESO devices, according to some embodiments described herein.

FIG. 7A shows combinatorial MESO logic 700 including stages 701 through 706 having MESO devices, according to some embodiments described herein. FIG. 7B is a waveform diagram for signal VG in combinatorial MESO logic 700 of FIG. 7A, according to some embodiments described herein. FIG. 7C is a waveform diagram for currents in the MESO devices of combinatorial MESO logic 700 of FIG. 7A, according to some embodiments described herein. FIG. 7D is a waveform diagram showing switching of states in MESO devices of combinatorial MESO logic 700 of FIG. 7A, according to some embodiments described herein. As shown in FIG. 7A, stages 701 through 706 can be connected in a cascaded fashion, such that the output node of one stage can be coupled to the input of another stage through a conductor (e.g., conductor 205). Each of MESO1 through MESO6 devices of MESO logic 700 in FIG. 7A can include a MESO device as described above with reference to FIG. 2A through FIG. 6C. Each of MESO1 through MESO6 devices of FIG. 7A can have the structures of MESO device 231 or 232 (FIG. 2A). Thus, for simplicity, detailed description and operations of the MESO devices of MESO logic 700 in FIG. 7A are omitted. Also for simplicity, details of only MESO1 device and details of MESO2 device (except for $R_{IREE}$, $R_{IC}$, and the current source of MESO2 device) of MESO logic 700 are shown in FIG. 7A. Other MESO devices (e.g., MESO3 through MESO6) can include components and connections coupled in a similar way to MESO1 device.

As shown in FIG. 7A, combinatorial MESO logic 700 can include conductive paths 794 and 795, which can correspond to conductive paths 294 and 295, respectively, of FIG. 3. Combinatorial MESO logic 700 in FIG. 7A can include transistors M1 and M2 that can be shared among MESO1 through MESO6 devices to couple each of stages 701 through 706 to a node 791 (e.g., supply voltage $V_{DD}$) and to a node 790 (e.g., ground). Transistors M1 and M2 can be controlled by signal VG.

In operation, signal VG can be provided with a voltage (e.g., 0.8V) to couple MESO1 through MESO6 devices to nodes 790 and 791. When an input current (e.g., $I_{OUT1}$) is injected into the input node of MESO1 device (e.g., a node coupled to the magnetoelectric capacitor included in ME layer 206 of MESO1), the input current triggers the switching of MESO1 device. The MESO state of MESO1 device can propagate from MESO1 device to MESO6 device. When signal VG is provided with another voltage (e.g., 0V or ground), the MESO states in respective MESO devices remain unchanged. As shown in FIG. 7A, MESO1 through MESO6 devices have currents $I_{OUT1}$ through $I_{OUT6}$ and switching actions indicated by the switching from −Q to +Q or from +Q to −Q.

As shown in FIG. 7B, signal VG can be provided with a positive (e.g., 0.8V) value between times T0 and T1, and with 0V after time T1. FIG. 7C shows the waveforms of currents $I_{OUT1}$ through $I_{OUT6}$. FIG. 7D shows the state of MESO1 device propagating from MESO1 device to MESO6 device during a portion of the time interval between times T0 and T1. After time T1 (when signal VG is provided with 0V), MESO1 through MESO6 devices remain unchanged at their respective states (either state "0" or state "1").

Figure 8A:
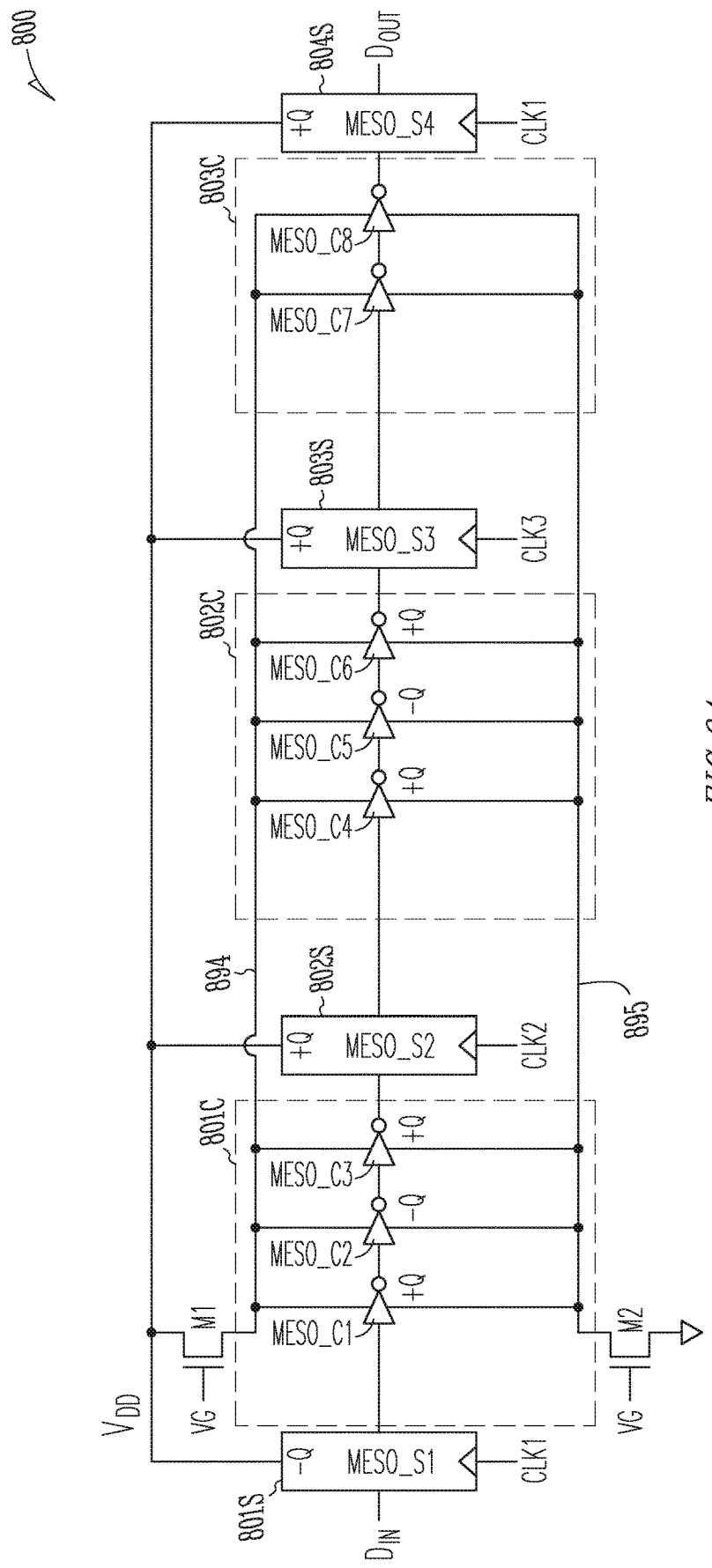
FIG. 8A shows a MESO logic including cascaded combinatorial MESO logic circuits and sequential MESO logic circuits, according to some embodiments described herein.
Figure 8B:
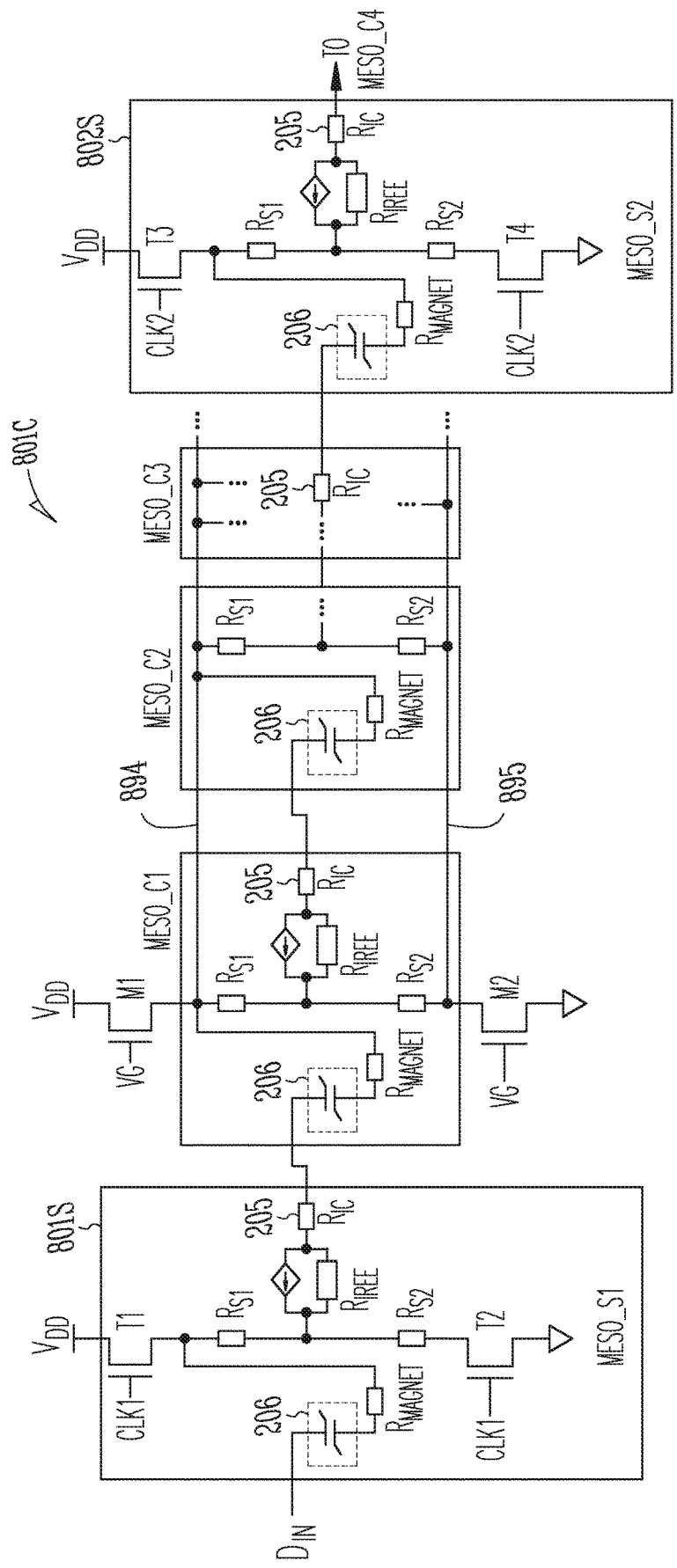
FIG. 8B, FIG. 8C, and FIG. 8D show details of different parts of the MESO logic of FIG. 8A, according to some embodiments described herein.
Figure 8C:
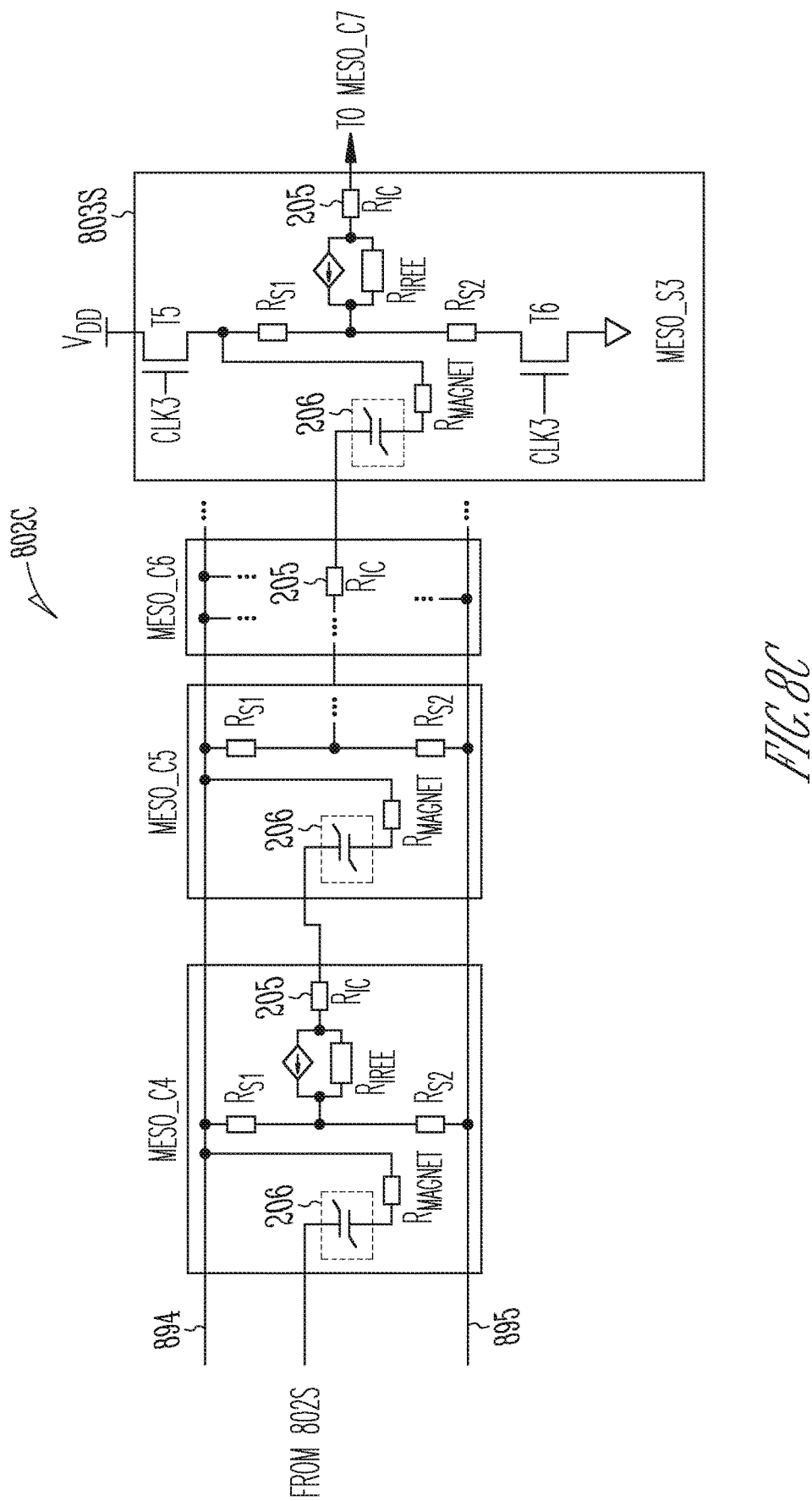
Figure 8D:
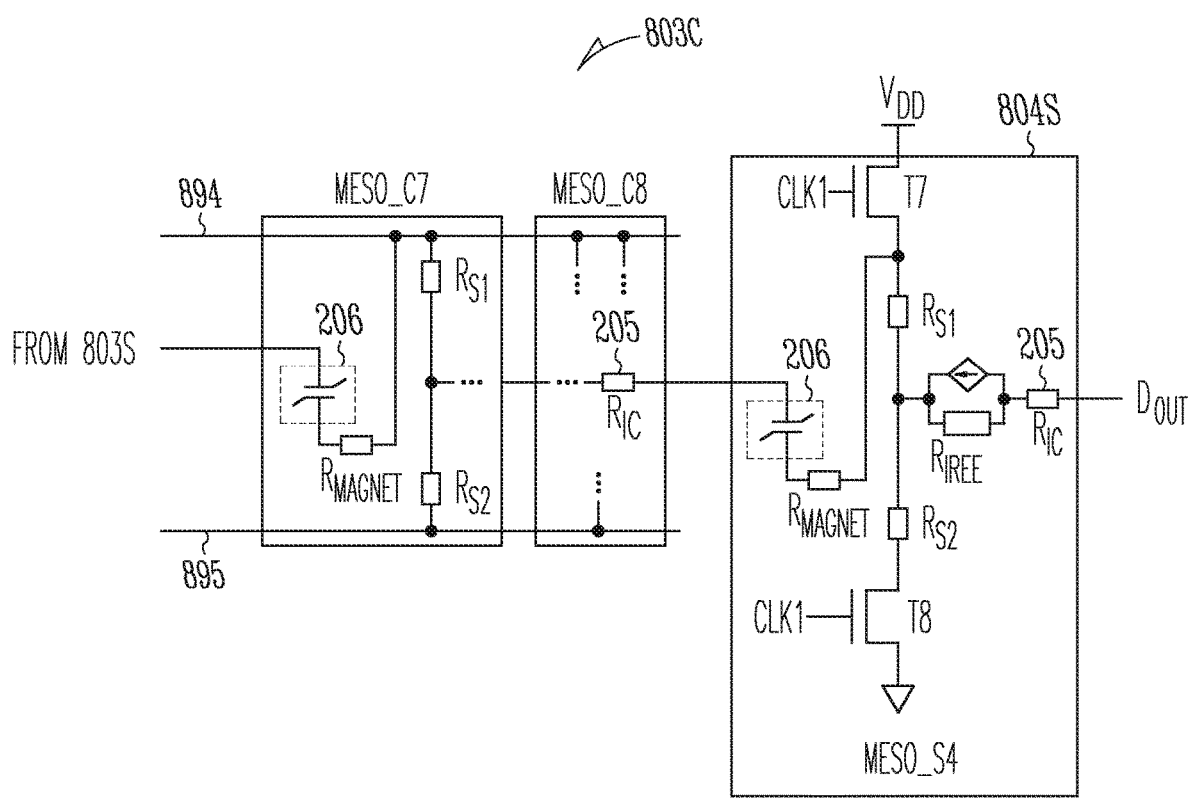

FIG. 8A show MESO logic 800 including cascaded combinatorial MESO logic circuits and sequential MESO logic circuits, according to some embodiments described herein. FIG. 8B, FIG. 8C, and FIG. 8D show details of different parts of MESO logic 800, according to some embodiments described herein.

As shown in FIG. 8A, MESO logic 800 can include logic circuits 801S, 802S, 803S, 804S, 801C, 802C, and 803C. For simplicity, FIG. 8A shows inverters and clocked flip-flops as components of logic circuits 801S, 802S, 803S, 804S, 801C, 802C, and 803C. However, the structure of MESO logic 800 can include MESO devices (e.g., MESO state elements) as shown in FIGS. 8B-8D.

In FIG. 8A, each of logic circuits (e.g., MESO sequential logic circuits) 801S, 802S, 803S, and 804S can include at least one MESO device that can be part of a sequential logic circuit (e.g., a MESO sequential logic circuit). For example, logic circuits 801S, 802S, 803S, and 804S can include MESO devices MESO_S1, MESO_S2, MESO_S3, and MESO_S4, respectively. Each of MESO_S1 through MESO_S4 devices can include a MESO device as described above with reference to FIG. 2A through FIG. 7D. Each of MESO_S1 through MESO_S4 devices of FIG. 8A can have the structures of MESO device 231 or 232 (FIG. 2A). However, unlike the MESO devices described above (e.g., MESO1 and MESO2 devices), each of MESO_S1 through MESO_S4 devices of logic circuits 801S, 802S, 803S, and 804S can operate based on the timing of a respective clock signal (e.g., periodical signal) such as clock signal CLK1, CLK2, or CLK3.

Each of logic circuits (e.g., MESO combinatorial logic circuits) 801C, 802C, and 803C can include at least one MESO device that can be part of a combinatorial logic circuit (e.g., a MESO combinatorial logic circuit). For example, logic circuit 801C can include MESO devices MESO_C1, MESO_C2, and MESO_C3. Logic circuit 802C can include MESO devices MESO_C4, MESO_C5, and MESO_C6. Logic circuit 803C can include MESO devices MESO_C7 and MESO_C8. Each of MESO_C1 through MESO_C8 devices can include a MESO device (e.g., MESO1 device or MESO2 device) as described above with reference to FIG. 2A through FIG. 7D. Each of MESO_C1 through MESO_C8 devices of logic circuits 801C, 802C, and 803C of FIG. 8A can have the structures of MESO device 231 or 232 (FIG. 2A).

As shown in FIG. 8A, MESO logic 800 can include transistors M1 and M2 that can be shared among logic circuits 801C, 802C, and 803C (e.g., MESO combinatorial logic circuits). Transistors M1 and M2 can operate like transistors M1 and M2 described above with reference to FIG. 2A through FIG. 7D. For example, transistors M1 and M2 can be controlled by signal VG to couple logic circuits 801C, 802C, and 803C to a voltage $V_{DD}$ (e.g., supply voltage) through a conductive path 894, and to ground through a conductive path 895.

One or both of transistors M1 and M2 can be omitted from MESO logic 800. For example, in an alternative structure of MESO logic 800, transistor M2 can be omitted and MESO devices (e.g., MESO_C1 through MESO_C8 devices) of logic circuits 801C, 802C, and 803C can be directly coupled to ground (without going through a transistor, such as transistor M2). In another example, in another alternative structure of MESO logic 800, both transistors M1 and M2 can be omitted and MESO devices (e.g., MESO_C1 through MESO_C8 devices) of logic circuits 801C, 802C, and 803C can be directly coupled to a supply node that provides voltage $V_{DD}$ (without going through a transistor, such as transistor M1) and directly coupled to ground (without going through a transistor, such as transistor M2). However, the inclusion of transistors M1 and M2 in MESO logic 800 can save power (e.g., by turning off MESO devices of logic circuits 801C, 802C, and 803C when they are not used in a particular logic operation).

In FIG. 8A, each of MESO devices MESO_S1 through MESO_S4 and MESO_C1 through MESO_C8 can have a state (e.g., MESO state "0" or MESO state "1") indicated by −Q or +Q in FIG. 8A. The state of each of these MESO devices can change from one state to another (e.g., from "0" to "1" or from "1" to "0") based on input information (e.g., input data) DIN. The value of information $D_{IN}$ can be in the form of a value of an input current (e.g., current $I_{CHARGE(IN)}$ or $I_{IN}$) as described above with reference to FIG. 2A through FIG. 7D. MESO logic 800 in FIG. 8A can provide output information (e.g., output data) $D_{OUT}$. The value of information $D_{OUT}$ can be based on the value of information $D_{IN}$ and the function of MESO logic 800. In FIG. 8A, the number (quantity) of components (e.g., MESO devices) shown in each of logic circuits 801S, 802S, 803S, 804S, 801C, 802C, and 803C is an example number. However, each of logic circuits 801S, 802S, 803S, 804S, 801C, 802C, and 803C can have a number of components different from the number of components shown in FIG. 8A.

FIG. 8B shows part of MESO logic 800 that includes logic circuits 801S and 802S, and logic circuit 801C. MESO_C1, MESO_C2, and MESO_C3 devices of logic circuit 801C can include MESO devices that are similar to or identical to the MESO devices of FIG. 3, FIG. 5A, FIG. 6A, and FIG. 7A. MESO_S1 and MESO_S2 devices of logic circuits 801S and 802S, respectively, can also be similar to the MESO devices of FIG. 3, FIG. 5A, FIG. 6A, and FIG. 7A. However, each of logic circuits 801S and 802S can have its own transistors (e.g., transistors T1 and T2 in logic circuit 801S, and transistors T3 and T4 in logic circuit 802S) to couple their respective MESO devices to a supply voltage (e.g., $V_{DD}$) and ground. Further, unlike transistors M1 and M2 (which can be controlled by a non-clock signal (e.g., VG)), each of transistors T1, T2, T3, and T4 of logic circuits 801S and 802S is controlled by a clock signal (e.g., CLK1 or CLK2). For example, each of transistors T1, T2, T3, and T4 includes a gate to receive a clock signal (e.g., CLK1 or CLK2) to turn on or turn off a respective transistor based on the phases of the received clock signal.

FIG. 8C shows part of MESO logic 800 that includes logic circuits 802C and 803S. MESO_C4, MESO_C5, and MESO_C6 devices of logic circuit 802C can include MESO devices that are similar to or identical to the MESO devices of FIG. 3, FIG. 5A, FIG. 6A, and FIG. 7A. MESO_S3 device of logic circuit 803S can also be similar to the MESO devices of FIG. 3, FIG. 5A, FIG. 6A, and FIG. 7A. However, logic circuit 803S can include transistors (e.g., transistors T5 and T6) which are controlled by a clock signal CLK3 to couple its MESO devices to a supply voltage (e.g., $V_{DD}$) and ground. For example, each of transistors T5 and T6 of logic circuit 803S can include a gate to receive clock signal CLK3 to turn on or turn off a respective transistor based on the phases of clock signal CLK3.

FIG. 8D shows part of MESO logic 800 that includes logic circuits 803C and 804S. MESO_C7 and MESO_C8 devices of logic circuit 803C can include MESO devices that are similar to or identical to the MESO devices of FIG. 3, FIG. 5A, FIG. 6A, and FIG. 7A. MESO_S4 device of logic circuit 804S can also be similar to the MESO devices of FIG. 3, FIG. 5A, FIG. 6A, and FIG. 7A. However, logic circuit 804S can include transistors (e.g., transistors T7 and T8) which are controlled by clock signal CLK1 to couple its MESO devices to a supply voltage (e.g., $V_{DD}$) and ground. For example, each of transistors T7 and T8 can include a gate to receive clock signal CLK1 to turn on or turn off a respective transistor based on the phases of clock signal CLK1.

Figure 8E:
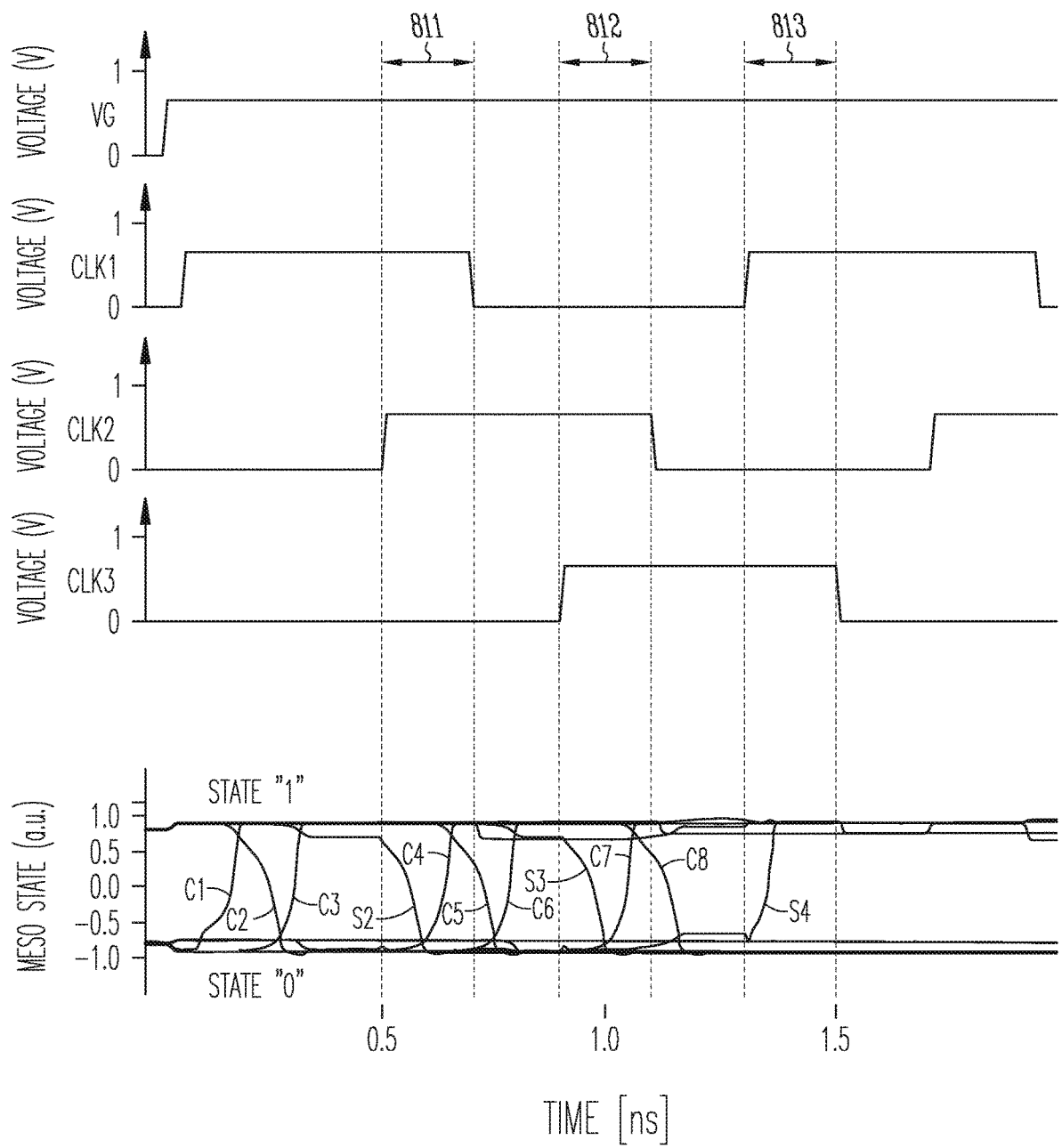
FIG. 8E shows waveforms of a gating signal, clock signals, and MESO states of MESO devices during operations of combinatorial MESO logic circuits and sequential MESO logic circuits of the MESO logic of FIG. 8A, according to some embodiments described herein.

FIG. 8E shows waveforms of signal VG and clock signals CLK1, CLK2, and CLK3, and MESO states of the MESO devices of MESO logic 800 during the operation of logic circuits (e.g., combinatorial MESO logic circuits) 801C, 802C, and 803C, and logic circuits (e.g., sequential MESO logic circuits) 801S, 802S, 803S, and 804S. The following description refers to FIG. 8A and FIG. 8E. As shown in FIG. 8E, the MESO devices of MESO logic 800 can be controlled by a three-phase clock where clock signals CLK1, CLK2, and CLK3 can be phase-shifted by ⅓ of the clock period. As shown in FIG. 8E, clock signals CLK1 and CLK2 can have overlapping phases during a time interval 811 during which both clock signals CLK1 and CLK2 can have a "high" (e.g., 0.8V) level. Clock signals CLK2 and CLK3 can have overlapping phases during a time interval 812 during which both clock signals CLK2 and CLK3 can have a "high" (e.g., 0.8V) level. Clock signals CLK1 and CLK3 can have overlapping phases during a time interval 813 during which both clock signals CLK1 and CLK3 can have a "high" (e.g., 0.8V) level.

In FIG. 8E, waveforms labeled C1 through C8 indicate the MESO state changes of MESO_C1 through MESO_C8 devices, respectively. Waveforms labeled S2 through S4 indicate the MESO state changes of MESO_S2 through MESO_S4 devices, respectively. The state change of MESO_S1 (occurs before state changes of MESO_C1) is not shown in FIG. 8E.

During operation, when clock signal CLK1 is "high", the state of MESO_S1 device propagates through MESO_C1 to MESO_C3 devices. When clock signal CLK2 is "high", MESO_S2 device switches, and the state propagates through MESO_C4 to MESO_C6 devices. Similarly, when clock signal CLK3 is "high", MESO_S3 device switches, and the state propagates through MESO_C7 and MESO_C8. As shown in FIG. 8A, MESO_S4 device can be controlled by the same clock signal CLK1 as MESO_S1 device. The three-phase clock (as shown in FIG. 8E) is used to control the cascaded MESO device switching. For example, when two clock signals have overlapping phases (e.g., during time intervals 811, 812, and 813), a state propagates from one MESO device to another.

Thus, as shown in FIG. 8A through FIG. 8E, cascaded combinatorial MESO logic circuits (e.g., logic circuits 801C, 802C, and 803C) and sequential MESO logic circuits (e.g., logic circuits 801S, 802S, 803S, and 804S) can be combined to provide a complete logic function (e.g., a logic function performed by MESO logic 800). As mentioned above, the MESO devices in the techniques described herein consume relatively low power. Thus, MESO logic 800 (which includes combinatorial MESO logic circuits and sequential MESO logic circuits) can be used to construct a MESO logic family for ultra-low-energy MESO-based computing systems.

Figure 9:
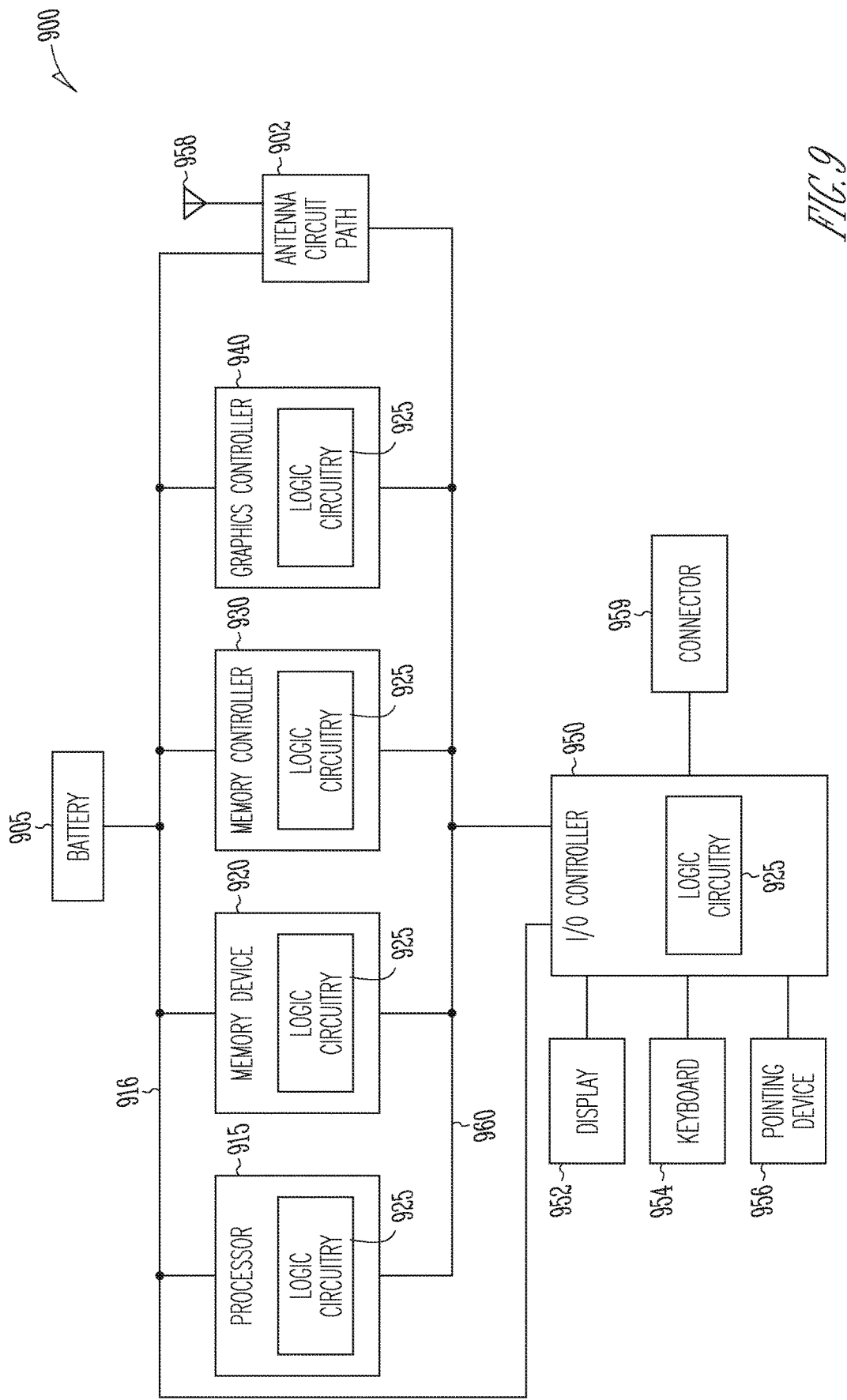
FIG. 9 shows an apparatus in the form of an electronic system, according to some embodiments described herein.

FIG. 9 shows an apparatus in the form of a system (e.g., electronic system) 900, according to some embodiments described herein. System 900 can include or be included in a computer, a tablet, or other electronic systems. As shown in FIG. 9, system 900 can include components such as a battery 905, a processor 915, a memory device 920, a memory controller 930, a graphics controller 940, an input and output (I/O) controller 950, a display 952, a keyboard 954, a pointing device 956, at least one antenna 958, an antenna circuit path 902, a connector 959, and a bus 960. Bus 960 can include conductive lines (e.g., metal-based traces on a circuit board where the components of system 900 are located).

In some arrangements, system 900 does not have to include a display. Thus, display 952 can be omitted from system 900. In some arrangements, system 900 does not have to include any antenna. Thus, antenna 958 can be omitted from system 900.

Battery 905 can provide power to the components of system 900 (e.g., through a power delivery path 916), such as to processor 915, memory device 920, memory controller 930, graphics controller 940, and I/O controller 950.

Processor 915 can include a general-purpose processor or an application-specific integrated circuit (ASIC). Processor 915 can include a central processing unit (CPU).

Memory device 920 can include a dynamic random-access memory (DRAM) device, a static random-access memory (SRAM) device, a flash memory device, a phase change memory device, a combination of these memory devices, or other types of memory. FIG. 9 shows an example where memory device 920 is a stand-alone memory device separated from processor 915. In an alternative arrangement, memory device 920 and processor 915 can be located on the same die. In such an alternative arrangement, memory device 920 is an embedded memory in processor 915, such as embedded DRAM (eDRAM), embedded SRAM (eSRAM), embedded flash memory, or another type of embedded memory.

Display 952 can include a liquid crystal display (LCD), a touchscreen (e.g., capacitive or resistive touchscreen), or another type of display. Pointing device 956 can include a mouse, a stylus, or another type of pointing device.

I/O controller 950 can include a communication module for wired or wireless communication (e.g., communication through one or more antennas 958). Such wireless communication may include communication in accordance with a WiFi communication technique, a Long-Term Evolution Advanced (LTE-A) communication technique, or other communication techniques.

I/O controller 950 can also include a module to allow system 900 to communicate with other devices or systems in accordance with one or more standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 959 can be arranged (e.g., can include terminals, such as pins) to allow system 900 to be coupled to an external device (or system). This may allow system 900 to communicate (e.g., exchange information) with such a device (or system) through connector 959.

Connector 959 and at least a portion of bus 960 can include conductive lines that conform with at least one of USB, DP, HDMI, Thunderbolt, PCIe, Ethernet, and other specifications.

As shown in FIG. 9, each of processor 915, memory device 920, memory controller 930, graphics controller 940, and I/O controller 950 can include logic circuitry 925. Logic circuitry 925 can include logic circuitry 125 of FIG. 1 and can include any of the MESO devices and logic circuits described above with reference to FIG. 1 through FIG. 8E.

FIG. 9 shows an example where each of processor 915, memory device 920, memory controller 930, graphics controller 940, and I/O controller 950 includes logic circuitry 925. However, in some arrangements, some of processor 915, memory device 920, memory controller 930, graphics controller 940, and I/O controller 950 may not include logic circuitry 925.

FIG. 9 shows the components of system 900 arranged separately from each other as an example. For example, each of processor 915, memory device 920, memory controller 930, graphics controller 940, and I/O controller 950 can be located on a separate IC (e.g., a semiconductor die or an IC chip). In some arrangements, two or more components (e.g., antenna circuit path 902, processor 915, memory device 920, graphics controller 940, and I/O controller 950) of system 900 can be located on the same die (e.g., same IC chip) that forms a system-on-chip (SoC) or located on the same IC package that forms a system-on-package (SoP) or system-in-package (SiP).

The illustrations of the apparatuses (e.g., apparatus 100 and system 900 including MESO devices and MESO logic) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set-top boxes, and others.

ADDITIONAL NOTES AND EXAMPLES

Example 1 includes subject matter (such as a device, an electronic apparatus (e.g., circuit, electronic system, or both), or a machine) including a first magnet, a first stack of layers coupled to a first portion of the first magnet, wherein the first stack of layers is to provide an inverse spin orbit coupling effect, a first layer coupled to a second portion of the first magnet, the first layer comprising a magnetoelectric material, a second magnet, a second stack of layers coupled to a first portion of the second magnet, wherein the second stack of layers is to provide an inverse spin orbit coupling effect, a second layer coupled to a second portion of the second magnet, the second layer including a magnetoelectric material, a conductor coupled to the first stack of layers and to the second layer, and a conductive path coupled to the first portion of the first magnet and to the first portion of the second magnet.

In Example 2, the subject matter of Example 1 may optionally include, further comprising a transistor, the transistor including a first terminal coupled to a supply node and a second terminal coupled to the conductive path.

In Example 3, the subject matter of Example 2 may optionally include, further comprising an additional conductive path coupled to the first stack of layers and to the second stack of layers.

In Example 4, the subject matter of Example 3 may optionally include, further comprising an additional transistor, the additional transistor including a first terminal coupled to the additional conductive path and a second terminal coupled to an additional supply node.

In Example 5, the subject matter of Example 4 may optionally include, wherein the supply node includes a positive supply voltage connection, and the additional supply node includes a ground connection.

In Example 6, the subject matter of Example 4 may optionally include, wherein the transistor and the additional transistor include transistors of a same conductivity type.

In Example 7, the subject matter of any of Examples 1-6 may optionally include, further comprising a third magnet, a third stack of layers coupled to a first portion of the third magnet, wherein the third stack of layers is to provide an inverse spin orbit coupling effect, a third layer coupled to a second portion of the third magnet, the third layer including a magnetoelectric material, and an additional conductor coupled to the third layer and to the second stack of layers, wherein the conductive path is further coupled to the first portion of the third magnet.

In Example 8, the subject matter of Example 7 may optionally include, further comprising an additional conductive path coupled to the first stack of layers, to the second stack of layers, and to the third stack of layers.

In Example 9, the subject matter of Example 1 may optionally include, wherein each of the first and second layers includes at least one of Cr, O, $Cr_2O_3$, or a multiferroic material.

In Example 10, the subject matter of Example 1 may optionally include, wherein each of the first and second stacks of layers includes at least one of $\beta$-Ta, $\beta$-W, W, Pt, Cu doped with iridium, Cu doped with bismuth, and Cu doped with an element of 3d, 4d, 5d, 4f, or 5f of periodic table groups.

In Example 11, the subject matter of Example 1 may optionally include, wherein each of the first and second magnets includes one of a paramagnet and a ferromagnet.

In Example 12, the subject matter of Example 15 may optionally include, wherein a first magnet, a first stack of layers coupled to a first portion of the first magnet, wherein the first stack of layers is to provide an inverse spin orbit coupling effect, a first layer coupled to a second portion of the first magnet, the first layer including a magnetoelectric material, a second magnet, a second stack of layers coupled to a first portion of the second magnet, wherein the second stack of layers is to provide an inverse spin orbit coupling effect, a second layer coupled to a second portion of the second magnet, the second layer including a magnetoelectric material, a conductor coupled to the first stack of layers and to the second layer, a first transistor coupled to the first magnet and to a supply node, the first transistor including a gate to receive a clock signal, and a second transistor coupled to the second magnet and to the supply node, the second transistor including a gate to receive a non-clock signal.

In Example 13, the subject matter of Example 12 may optionally include, further comprising a first additional transistor coupled to the first stack of layers and to an additional supply node, the first additional transistor including a gate to receive the clock signal, and a second additional transistor coupled to the second stack of layers and to the additional supply node, the second additional transistor including a gate to receive the non-clock signal.

In Example 14, the subject matter of Example 13 may optionally include, wherein the supply node includes a positive supply voltage connection, and the additional supply node includes a ground connection.

In Example 15, the subject matter of any of Examples 12-14 may optionally include, further comprising a third magnet, a third stack of layers coupled to a first portion of the third magnet, wherein the third stack of layers is to provide an inverse spin orbit coupling effect, a third layer coupled to a second portion of the third magnet, the third layer including a magnetoelectric material, an additional conductor coupled to the third layer and to the second stack of layers, and a conductive path coupled to the first portion of the second magnet and to the first portion of the third magnet.

Example 16 includes subject matter (such as a device, an electronic apparatus (e.g., circuit, electronic system, or both), or a machine) including a supply node, and a logic circuit coupled to the supply node, the logic circuit including a first magnet, a first stack of layers coupled to a first portion of the first magnet, wherein the first stack of layers is to provide an inverse spin orbit coupling effect, a first layer coupled to a second portion of the first magnet, the first layer including a magnetoelectric material, a second magnet, a second stack of layers coupled to a first portion of the second magnet, wherein the second stack of layers is to provide an inverse spin orbit coupling effect, a second layer coupled to a second portion of the second magnet, the second layer including a magnetoelectric material, a conductor coupled to the first stack of layers and to the second layer, a conductive path coupled to the first portion of the first magnet and to the first portion of the second magnet, and a transistor coupled to the supply node and to the conductive path.

In Example 17, the subject matter of Example 16 may optionally include, further comprising an additional logic circuit, the additional logic circuit including a third magnet, a third stack of layers coupled to a first portion of the third magnet, wherein the third stack of layers is to provide an inverse spin orbit coupling effect, a third layer coupled to a second portion of the third magnet, the third layer including a magnetoelectric material, and an additional conductor coupled to the third layer and to the second magnet.

In Example 18, the subject matter of Example 17 may optionally include, wherein the additional logic circuit includes an additional transistor coupled to the supply node and to the third magnet.

In Example 19, the subject matter of Example 18 may optionally include, wherein the additional transistor includes a gate to receive a clock signal.

In Example 20, the subject matter of Example 19 may optionally include, wherein the transistor includes a gate to receive a non-clock signal.

In Example 21, the subject matter of any of Examples 17-20 may optionally include, wherein the additional logic circuit is a first additional logic circuit, and the apparatus further comprises a second additional logic circuit, the second additional logic circuit including a fourth magnet, a fourth stack of layers coupled to a first portion of the fourth magnet, wherein the fourth stack of layers is to provide an inverse spin orbit coupling effect, a fourth layer coupled to a second portion of the fourth magnet, the fourth layer including a magnetoelectric material, and a second additional conductor coupled to the fourth layer and to the fourth magnet, wherein the conductive path is further coupled to the first portion of the fourth magnet.

In Example 22, the subject matter of Example 17 may optionally include, wherein the additional logic circuit is a first additional logic circuit, and the apparatus further comprises a second additional logic circuit, the second additional logic circuit including a fourth magnet, a fourth stack of layers coupled to a first portion of the fourth magnet, wherein the fourth stack of layers is to provide an inverse spin orbit coupling effect, a fourth layer coupled to a second portion of the fourth magnet, the fourth layer including a magnetoelectric material, a second additional conductor coupled to the fourth layer and to the first magnet, and an additional transistor coupled to the supply node and to the fourth magnet, the additional transistor including a gate to receive a clock signal.

In Example 23, the subject matter of Example 22 may optionally include, wherein the additional transistor is a first additional transistor and the clock signal is a first clock signal, the apparatus further comprising a second additional transistor coupled to the supply node and to the third magnet, the second additional transistor including a gate to receive a second clock signal, wherein the first and second clock signals have overlapping phases.

Example 24 includes subject matter such as a device, an electronic apparatus (e.g., circuit, electronic system, or both), or a machine) including an antenna, and a processor coupled to the antenna, the processor including a first magnet, a first stack of layers coupled to a first portion of the first magnet, wherein the first stack of layers is to provide an inverse spin orbit coupling effect, a first layer coupled to a second portion of the first magnet, the first layer comprising a magnetoelectric material, a second magnet, a second stack of layers coupled to a first portion of the second magnet, wherein the second stack of layers is to provide an inverse spin orbit coupling effect, a second layer coupled to a second portion of the second magnet, the second layer including a magnetoelectric material, a conductor coupled to the first stack of layers and to the second layer, and a conductive path coupled to the first portion of the first magnet and to the first portion of the second magnet.

In Example 25, the subject matter of Example 24 may optionally include, further comprising a connector coupled to the processor, the connector conforming with one of Universal Serial Bus (USB), High-Definition Multimedia Interface (HDMI), Thunderbolt, Peripheral Component Interconnect Express (PCIe), and Ethernet specifications.

The subject matter of Example 1 through Example 25 may be combined in any combination.

In the detailed description and the claims, a list of items joined by the term "one of" can mean only one of the listed items. For example, if items A and B are listed, then the phrase "one of A and B" means A only (excluding B), or B only (excluding A). In another example, if items A, B, and C are listed, then the phrase "one of A, B, and C" means A only, B only, or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only, B only, or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

The above description and the drawings show some embodiments to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
   a first magnet;
   a first stack of layers coupled to a first portion of the first magnet, wherein the first stack of layers is to provide an inverse spin orbit coupling effect;
   a first layer coupled to a second portion of the first magnet, the first layer comprising a magnetoelectric material;
   a second magnet;

a second stack of layers coupled to a first portion of the second magnet, wherein the second stack of layers is to provide an inverse spin orbit coupling effect;
a second layer coupled to a second portion of the second magnet, the second layer including a magnetoelectric material;
a conductor coupled to the first stack of layers and to the second layer; and
a conductive path coupled to the first portion of the first magnet and to the first portion of the second magnet.

2. The apparatus of claim 1, further comprising a transistor, the transistor including a first terminal coupled to a supply node and a second terminal coupled to the conductive path.

3. The apparatus of claim 2, further comprising an additional conductive path coupled to the first stack of layers and to the second stack of layers.

4. The apparatus of claim 3, further comprising an additional transistor, the additional transistor including a first terminal coupled to the additional conductive path and a second terminal coupled to an additional supply node.

5. The apparatus of claim 4, wherein the supply node includes a positive supply voltage connection, and the additional supply node includes a ground connection.

6. The apparatus of claim 4, wherein the transistor and the additional transistor include transistors of a same conductivity type.

7. The apparatus of claim 1, further comprising:
a third magnet;
a third stack of layers coupled to a first portion of the third magnet, wherein the third stack of layers is to provide an inverse spin orbit coupling effect;
a third layer coupled to a second portion of the third magnet, the third layer including a magnetoelectric material; and
an additional conductor coupled to the third layer and to the second stack of layers, wherein the conductive path is further coupled to the first portion of the third magnet.

8. The apparatus of claim 7, further comprising an additional conductive path coupled to the first stack of layers, to the second stack of layers, and to the third stack of layers.

9. The apparatus of claim 1, wherein each of the first and second layers includes at least one of Cr, O, $Cr_2O_3$, or a multiferroic material.

10. The apparatus of claim 1, wherein each of the first and second stacks of layers includes at least one of β-Ta, β-W, W, Pt, Cu doped with iridium, Cu doped with bismuth, and Cu doped with an element of 3d, 4d, 5d, 4f, or 5f of periodic table groups.

11. The apparatus of claim 1, wherein each of the first and second magnets includes one of a paramagnet and a ferromagnet.

12. An apparatus comprising:
a first magnet;
a first stack of layers coupled to a first portion of the first magnet, wherein the first stack of layers is to provide an inverse spin orbit coupling effect;
a first layer coupled to a second portion of the first magnet, the first layer including a magnetoelectric material;
a second magnet;
a second stack of layers coupled to a first portion of the second magnet, wherein the second stack of layers is to provide an inverse spin orbit coupling effect;
a second layer coupled to a second portion of the second magnet, the second layer including a magnetoelectric material;
a conductor coupled to the first stack of layers and to the second layer;
a first transistor coupled to the first magnet and to a supply node, the first transistor including a gate to receive a clock signal; and
a second transistor coupled to the second magnet and to the supply node, the second transistor including a gate to receive a non-clock signal.

13. The apparatus of claim 12, further comprising:
a first additional transistor coupled to the first stack of layers and to an additional supply node, the first additional transistor including a gate to receive the clock signal; and
a second additional transistor coupled to the second stack of layers and to the additional supply node, the second additional transistor including a gate to receive the non-clock signal.

14. The apparatus of claim 13, wherein the supply node includes a positive supply voltage connection, and the additional supply node includes a ground connection.

15. The apparatus of claim 12, further comprising:
a third magnet;
a third stack of layers coupled to a first portion of the third magnet, wherein the third stack of layers is to provide an inverse spin orbit coupling effect;
a third layer coupled to a second portion of the third magnet, the third layer including a magnetoelectric material;
an additional conductor coupled to the third layer and to the second stack of layers; and
a conductive path coupled to the first portion of the second magnet and to the first portion of the third magnet.

16. An apparatus comprising:
a supply node; and
a logic circuit coupled to the supply node, the logic circuit including:
a first magnet;
a first stack of layers coupled to a first portion of the first magnet, wherein the first stack of layers is to provide an inverse spin orbit coupling effect;
a first layer coupled to a second portion of the first magnet, the first layer including a magnetoelectric material;
a second magnet;
a second stack of layers coupled to a first portion of the second magnet, wherein the second stack of layers is to provide an inverse spin orbit coupling effect;
a second layer coupled to a second portion of the second magnet, the second layer including a magnetoelectric material;
a conductor coupled to the first stack of layers and to the second layer;
a conductive path coupled to the first portion of the first magnet and to the first portion of the second magnet; and
a transistor coupled to the supply node and to the conductive path.

17. The apparatus of claim 16, further comprising an additional logic circuit, the additional logic circuit including:
a third magnet;
a third stack of layers coupled to a first portion of the third magnet, wherein the third stack of layers is to provide an inverse spin orbit coupling effect;

a third layer coupled to a second portion of the third magnet, the third layer including a magnetoelectric material; and an additional conductor coupled to the third layer and to the second magnet.

18. The apparatus of claim 17, wherein the additional logic circuit includes an additional transistor coupled to the supply node and to the third magnet.

19. The apparatus of claim 18, wherein the additional transistor includes a gate to receive a clock signal.

20. The apparatus of claim 19, wherein the transistor includes a gate to receive a non-clock signal.

21. The apparatus of claim 17, wherein the additional logic circuit is a first additional logic circuit, and the apparatus further comprises a second additional logic circuit, the second additional logic circuit including:
a fourth magnet;
a fourth stack of layers coupled to a first portion of the fourth magnet, wherein the fourth stack of layers is to provide an inverse spin orbit coupling effect;
a fourth layer coupled to a second portion of the fourth magnet, the fourth layer including a magnetoelectric material; and
a second additional conductor coupled to the fourth layer and to the fourth magnet, wherein the conductive path is further coupled to the first portion of the fourth magnet.

22. The apparatus of claim 17, wherein the additional logic circuit is a first additional logic circuit, and the apparatus further comprises a second additional logic circuit, the second additional logic circuit including:
a fourth magnet;
a fourth stack of layers coupled to a first portion of the fourth magnet, wherein the fourth stack of layers is to provide an inverse spin orbit coupling effect;
a fourth layer coupled to a second portion of the fourth magnet, the fourth layer including a magnetoelectric material;
a second additional conductor coupled to the fourth layer and to the first magnet; and
an additional transistor coupled to the supply node and to the fourth magnet, the additional transistor including a gate to receive a clock signal.

23. The apparatus of claim 22, wherein the additional transistor is a first additional transistor and the clock signal is a first clock signal, the apparatus further comprising:
a second additional transistor coupled to the supply node and to the third magnet, the second additional transistor including a gate to receive a second clock signal, wherein the first and second clock signals have overlapping phases.

24. An electronic system comprising:
an antenna; and
a processor coupled to the antenna, the processor including:
a first magnet;
a first stack of layers coupled to a first portion of the first magnet, wherein the first stack of layers is to provide an inverse spin orbit coupling effect;
a first layer coupled to a second portion of the first magnet, the first layer comprising a magnetoelectric material;
a second magnet;
a second stack of layers coupled to a first portion of the second magnet, wherein the second stack of layers is to provide an inverse spin orbit coupling effect;
a second layer coupled to a second portion of the second magnet, the second layer including a magnetoelectric material;
a conductor coupled to the first stack of layers and to the second layer; and
a conductive path coupled to the first portion of the first magnet and to the first portion of the second magnet.

25. The apparatus of claim 24, further comprising a connector coupled to the processor, the connector conforming with one of Universal Serial Bus (USB), High-Definition Multimedia Interface (HDMI), Thunderbolt, Peripheral Component Interconnect Express (PCIe), and Ethernet specifications.

* * * * *